US008578312B2

(12) United States Patent
Papanikolaou et al.

(10) Patent No.: US 8,578,312 B2
(45) Date of Patent: Nov. 5, 2013

(54) METHOD AND APPARATUS FOR DESIGNING AND MANUFACTURING ELECTRONIC CIRCUITS SUBJECT TO LEAKAGE PROBLEMS CAUSED BY TEMPERATURE VARIATIONS AND/OR AGING

(75) Inventors: Antonis Papanikolaou, Leuven (BE); Miguel Miranda, Kessel-lo (BE); Francky Catthoor, Temse (BE); Hua Wang, Leuven (BE)

(73) Assignee: IMEC, Leuven (BE)

( * ) Notice: Subject to any disclaimer, the term of this patent is extended or adjusted under 35 U.S.C. 154(b) by 1466 days.

(21) Appl. No.: 11/252,370

(22) Filed: Oct. 17, 2005

(65) Prior Publication Data
US 2006/0253204 A1    Nov. 9, 2006

Related U.S. Application Data

(63) Continuation-in-part of application No. 11/095,494, filed on Mar. 30, 2005.

(60) Provisional application No. 60/612,427, filed on Sep. 23, 2004.

(51) Int. Cl.
*G06F 17/50* (2006.01)
(52) U.S. Cl.
USPC .......................................................... 716/110
(58) Field of Classification Search
USPC .......................................... 716/1, 2, 18, 110
See application file for complete search history.

(56) References Cited

U.S. PATENT DOCUMENTS

| 7,747,422 | B1 | 6/2010 | Sisley |
| 2001/0052106 | A1 | 12/2001 | Wuytack et al. |
| 2002/0099756 | A1* | 7/2002 | Catthoor et al. ............... 709/102 |
| 2004/0049744 | A1 | 3/2004 | Sherstyuk et al. |
| 2004/0216072 | A1 | 10/2004 | Alpert et al. |
| 2005/0044515 | A1* | 2/2005 | Acar et al. ......................... 716/5 |
| 2005/0138578 | A1* | 6/2005 | Alpert et al. ....................... 716/2 |
| 2005/0144576 | A1* | 6/2005 | Furuta et al. ....................... 716/4 |

OTHER PUBLICATIONS

Brockmeyer, E. et al., "Systematic Cycle Budget versus System Power Trade-off: a New Perspective on System Exploration of Real-time Data-dominated Applications", 2000, ISLPED '00, Proceedings of the 2000 International Symposium on Low Power Electronics and Design on Jul. 26-27, 2000, pp. 137-142.*

(Continued)

*Primary Examiner* — Suchin Parihar
(74) *Attorney, Agent, or Firm* — Knobbe Martens Olson & Bear LLP

(57) ABSTRACT

First several possible working points are stored with different mappings to available modules. Each of these working points involves different trade-offs for important criteria related to performance and costs. At the design stage, these trade-off points for the criteria are not calibrated to the actual run-time conditions. Subsequently, based on actual values of the leakage criteria caused by temperature variations and/or ageing at given run-time conditions for (a subset of) the working points, it is possible to calibrate the trade-off curves and use a run-time controller to select the most suited working points afterward for an actual circuit. These active working points are selected to just meet the necessary system requirements on performance, while minimizing any of the important cost parameters.

15 Claims, 23 Drawing Sheets

(56) References Cited

OTHER PUBLICATIONS

Givargis, T. et al., "System-level Exploration for Pareto-optimal Configurations in Parameterized Systems-on-a-chip", 2001, IEEE Press, Proceedings of the 2001 IEEE/ACM international conference on Computer-aided design, pp. 25-30.*

Office Action from EP 05 447 072.9, dated Aug. 21, 2009.

Man, De H. "Connecting e-dreams to deep-submicron realities" Lecture Notes in Computer Science, Springer Verlag, Berlin; De, vol. 3254, Jan. 1, 2004, p. 1, XP002356064 ISSN: 0302-9743.

Brockmeyer et al., "Systematic Cycle Budget versus System Power Trade-off: a New Perspective on System Exploration of Real-time Data-dominated Applications", 2000, ISLPED '00, Proceedings of the 2000 International Symposium on Low Power Electronics and Design on Jul. 26-27, 2000, pp. 137-142.

Givargis et al., "System-level Exploration for Pareto-optimal Configurations in Parameterized Systems-on-a-chip", 2001, IEEE Press, Proceedings of the 2001 IEEE/ACM international conference on Computer-aided design, pp. 25-30.

Papanikolaou et al., "Interconnect Exploration for Future Wire Dominated Technologies", invited paper at 4$^{th}$ ACM/IEEE Intnl. Wsh. On System Level Interconnect Prediction, San Diego, CA, Apr. 2002.

Papanikolaou et al., "Global interconnect trade-off for technology over memory modules to application level: case study", 5$^{th}$ ACM/IEEE Intnl. Wsh. On System Level Interconnect Prediction, Monterey, CA, Apr. 2003.

Papanikolaou et al., "Methodology for propagating technology trade-offs over memory modules to the application level", Proc. of Program Acceleration through Application and Architecture driven Code Transformations (PA3C1) workshop, pp. 71-73, Edegem, Belgium, Sep. 2003.

Papanikolaou et al., "Overcoming the "memory wall" by improved system design exploration and a better link to process technology options", Proc. ACM computing Frontiers Conf., pp. 202-211, Ischia, Italy, Apr. 2004.

Papanikolaou et al., "Memory communication network exploration for low-power distributed memory organizations", Proc. Program Acceleration through Application ad Architecture driven Code Transformations (PA3CT) workshop, pp. 71-73, Edegem, Belgium, Sep. 2004.

Wang et al., "A global bus power optimization methodology for physical design of memory dominated systems by coupling bus segmentation and activity driven block placement", Proc. IEEE Asia and South Pacific Design Autom. Conf. (ASPDAC), Yokohama, Japan, pp. 759-761, Jan. 2004.

\* cited by examiner

Rvector <R1...Rn>

Mvector = { <M1,..Mn> where Mi represents for each "element" (e.g.data array or instruction set or operation cluster or transfer block) a mapping with Start-time Si plus a resource assignment to Ri from Rvector}

Design-time phase
- Introduce redundancy in the modules of the SoC /platform so that assignment choice exists for the "elements". Preferably heterogeneous choices are available for all of these
- For all possible elements and given assignment options:
  - Define E/T operating points in the system by means of the design-time Pareto phase (with link to meta-flow).
  - The active and leak parts of each resource are separately characterized on these points
    These Pareto points should allow sufficient range variation for all critical system criteria (e.g. max power, energy, latency, throughput, QoS, ...)
  - *It is sufficient if all modules in the design (data/instr memory hierarchy, network and proc. nodes) have a reasonable range of Pareto points with at least about 5 evenly distributed working points to choose from. (I.e. not all meta-flow steps have to be applied).*

Fig. 7

- Run-time phase
  - The Pareto-controller is activated whenever the OS or some other part of the application code executing on the platform requires a new element to be mapped or an old element "dies" or when a temperature sensor indicates that a resource is exceeding a critical T or delta T.
  - Based on the current Mvector and the (future) work-load, the Pareto control manager decides on a new mapping (assignment and schedule) of the elements (e.g. data and computations) such that the total energy consumption (Pactive+Pleak) is minimized and the T-critical resources get a lower Pactive.
    Note: sufficient freedom is created for this search, because of the partially over-sized (redundant) resources on the platform.
  - In that way, the temperature should remain low everywhere and the Pleak should be kept very low too.

Fig. 9

Calibration phase after temperature variation or ageing affects the real operating conditions (again)

The calibration Pareto-controller is activated to trace all stored Pareto curves and operating points (which are "powered on" by means of the control knobs) and based on the monitros for time, energy etc it calibrates them to the correct "spatio-temporal" values.

In that way, the stored Pareto curves should be "accurate" everywhere and NO leakage caused by temperature variations and/or ageing effect tolerances are needed.

Of course, we still assume that the circuit remains functional so a too large offset of some parameters due to leakage caused by temperature variations and/or ageing will still lead to a failing circuit (which can be detected by an on-line self-test controller that deactivates this circuit from further use at run-time).

Fig. 8

Rvector <R1...Rn>

Mvector = { <M1,..Mn> where Mi represents for each "element" (e.g.data array or instruction set or operation cluster or transfer block) a mapping with Start-time Si plus a resource assignment to Ri from Rvector}

Design-time phase

- Introduce redundancy in the modules of the SoC/platform so that assignment choice exists for the elements. Preferably heterogeneous choices are available for all of these
- For all possible elements and given assignment options:
  - Define E/T Pareto operating points in the system by means of a simplified design-time exploration phase (no other meta-flow steps). This can start from an initial assignment provided externally plus a source code.
  - The active and leak parts of each resource are separately characterized on these points
    These Pareto points should allow sufficient range variation for all critical system criteria (e.g. max power, energy, latency, throughput, QoS, ...)
  - *It is sufficient if all modules in the design (data/instr memory hierarchy, network and proc. nodes) have a reasonable range of Pareto points with at least about 5 evenly distributed working points to choose from.*

Fig. 10

- Run-time phase
  - The Pareto-controller is activated whenever the OS or some other part of the application code executing on the platform requires a new element to be mapped or an old element "dies" or when a temperature sensor indicates that a resource is exceeding a critical T or delta T.
  - Based on the current Mvector, the Pareto control manager decides on a new mapping (assignment and schedule) of the elements (e.g. data and computations) such that the total energy consumption (Pactive+Pleak) is minimized and the T-critical resources get a lower Pactive.
  Because the combined mapping of the elements is not fully resolved in the design-time phase (mapping environment cannot be changed enough), the run-time manager also has to keep track of the life-times of the elements so which resources are free/occupied. This means less global exploration and more run-time overhead so lower gains.
  Note: sufficient freedom is created for this search, because of the partially over-sized (redundant) resources on the platform.
  - In that way, the temperature should remain low everywhere and the Pleak should be kept very low too.

Fig. 11

METHOD AND APPARATUS FOR DESIGNING AND MANUFACTURING ELECTRONIC CIRCUITS SUBJECT TO LEAKAGE PROBLEMS CAUSED BY TEMPERATURE VARIATIONS AND/OR AGING

CROSS-REFERENCE TO RELATED APPLICATIONS

This application is a continuation-in-part of U.S. application Ser. No. 11/095,494, filed Mar. 30, 2005, which claims priority to U.S. Provisional Application No. 60/612,427, filed Sep. 23, 2004, both of which are hereby incorporated herein by reference in their entirety.

BACKGROUND OF THE INVENTION

1. Field of the Invention

The invention relates to design methodologies for electrical systems, more in particular electrical circuits (especially digital circuits), to circuitry designed with said methodologies and to circuit parts, specially designed and incorporated within said digital circuits to enable operation of said circuits in accordance with the proposed concepts.

2. Description of the Related Art

Technology scaling has historically improved the performance of embedded systems, both in energy consumption and in speed. Scaling minimum feature sizes below 100 nm however, brings a host of problems, which cannot be completely solved at technology level. Back-end performance degradation and increased leakage currents are only a few examples. It is know in the art that future deep submicron (DSM) technologies will suffer more and more from leakage problems. Such leakage problems are temperature an/or ageing dependent.

Currently available thermal management of platforms already react on too high temperatures for certain modules but they try to remedy the situation when it has become "critical". So if the temperature within the modules reaches a too high value, they shut off the module and move the operations to other spare modules.

Leakage in future technology nodes is assumed to be dominated by gate and subthreshold leakage. The gate leakage can be kept under control by not reducing the oxide thickness too much and by using high-k materials. So technology innovations should keep that contribution low up till at least 45 nm. The subthreshold leakage, however, is not solvable by technology innovations. For the subthreshold leakage, either the threshold voltage Vt has to be kept high enough, or the temperature low enough (because subthreshold leakage rises exponentially with reducing threshold voltage). Keeping the threshold voltage Vt high means a significant penalty on delay, especially if the supply voltage Vdd is low enough to keep also the dynamic power low in future technology nodes.

Due to the stochastic nature of leakage caused by temperature variations and/or ageing, the only way to maximize the parametric system yield, i.e. the number of samples that meet the timing constraints, is either by incorporating corner-point analysis in the designs, or by run-time techniques which can measure the actual variability and adapt the operation of the system, because it is impossible to predict the impact of leakage caused by temperature variations and/or ageing on a system before the chip is processed, in particular in view of the temperature-dependence.

Especially deep submicron (DSM) technologies, e.g. process technology nodes for 65 nm and beyond, suffer from large variability in integrated circuit (IC) parameters. These variations may be due to, amongst others, the following reasons:

"temporal" differences due to "degradation" processes, i.e. ageing. These include electromigration (which influences resistance R and partly capacitance C of lines), self-annealing of Cu (which influences resistance R of lines), stability of low-k dielectrics (which influences R/C of lines) and of high-k dielectrics (which influences threshold voltage Vt), hot electron trapping (which also influences threshold voltage Vt) and cross-talk (which causes "pseudo C" changes and noise). These temporal differences should be relatively slow and easy to "follow up" or monitor.

"temperature-related" differences due to strong variations in temperature T over time. Because of this, threshold voltage Vt and resistance R of lines are influenced. These temperature-related differences can vary quite fast (up to msec range) and hence are more difficult to monitor and calibrate.

Memories are among the most leakage sensitive components of a system. The reason is that most of the transistors in a memory are minimum-sized and are thus more prone to leakage caused by temperature variations and ageing. Additionally some parts of the memories are analog blocks, whose operation and timing can be severely degraded by leakage caused by temperature variations and ageing.

In a target domain of multimedia applications, memories occupy the majority of the chip area even in current designs and contribute to the majority of the digital chip energy consumption. Therefore they are considered to be very important blocks for a system.

Leakage caused by temperature variations and ageing have thus become a serious problem for continued technology scaling. It becomes harder and harder to deal with this at the technology and circuit levels only. Several proposed schemes are not even scalable to deep-submicron technologies because the body-bias effect will become very small.

If these effects have to be characterized at "design time", and furthermore it has to be guaranteed that the design will still work under all possible conditions, in particular temperature conditions, the slack that will have to be introduced will become prohibitive in the deep-submicron era.

Maximizing parametric yield in memories via corner-point analysis and design will, by the size of the "clouds" due to leakage caused by temperature variations and ageing, lead to severe overheads in energy consumption and delay. The reason is that the memory design will use over-sized circuits and conservative timing margins to improve the predictability of the memory behavior by trading off performance.

SUMMARY OF THE INVENTION

An object of the present invention is to provide improved design environments and methodologies for electrical systems, more in particular to provide improved electrical circuits (especially digital circuits, analog circuits or mixtures or hybrids thereof), to provide improved circuitry designed with said methodologies or using said environments and to provide improved circuit parts, e.g. specially designed and incorporated within said electrical circuits to enable operation of said circuits in accordance with the proposed concepts. An advantage of the present invention is that it can avoid a worst-case design-time characterization of circuits when designing electrical circuits taking into account leakage variability caused by temperature variations and/or ageing in deep submicron technologies.

It is an aspect of the invention to provide dynamic run-time control of module assignment in order to solve leakage-based, i.e. temperature- or ageing-based, problems in future technologies (for instance sub-90 nm transistors).

The present invention is based on the so-called design-time run-time separation approach, wherein the design problem is dealt with at design-time but some decision-taking is done at run-time, the design time part being adapted so as to generate a substantial freedom for a run-time controller. In other words, the worst-case design margins are alleviated by designing the circuit in a way that allows the unpredictability of its behavior, even though the parametric specifications are not met at module level. For example, leakage problems caused by temperature variations and/or ageing during use of the actual circuit can be the cause of an unpredictable behavior at run time.

The information provided by the design-time part is communicated to the run-time controller via a format, such as e.g. a table, wherein circuit performance parameters (like timing performance, quality of the operation) are linked to cost parameters (like energy consumption), the performance-cost pairs together forming working points, said working points being pre-selected from a larger possibility set, said pre-selection being done at design-time. As an example so-called Pareto curves may be used for defining the pre-selected working points. In an alternative approach working points within an offset of such a Pareto curve are used (so-called fat Pareto curve approach). These approaches are fully explained in US 2002/0099756 (task concurrency management), US 2003/0085888 (quality-energy-timing Pareto approach), EP 03447082 (system-level interconnect). These representations of working points is denoted Pareto-like. An advantageous feature of these curves is that they provide a substantial range on the parameters. It is only in a preferred embodiment that they are selected to be optimal, in the Pareto-sense.

In contrast with the prior art the presented approach avoids the problem up-front by storing several possible working points with different assignments of the workload to the available modules. Based on the current temperature or ageing profile (run-time monitor) the best possible working point is selected at a given decision point (e.g. every 30 ms) so that the combined temperature- and/or ageing-dependent leakage power consumption plus dynamic energy remains the lowest for all modules together.

In a first aspect of the present invention, it is desired to avoid the problem of "stochastic analysis" and "clouds around nominal working points". First several possible working points are stored with different mappings to available modules. Each of these working points involves different trade-offs for important criteria related to performance (time budget, data rate, latency etc.) and costs (energy, memory foot-print etc.). Trade-offs are tuples comprising a value for a resource and the value for a constraint. The combination of values of the resource and the constraint are not necessarily an optimization but rather a selection of parameters which balance certain advantages and disadvantages in a useful manner. Initially, i.e. at the design stage, these trade-off points for the criteria are not calibrated to the actual run-time conditions (such as temperature or ageing). This calibration will occur with the actual circuit. However at the design stage the trade-offs can be and are preferably selected to be particularly useful with actual circuits, i.e. the trade-offs take into account typical temperature and ageing related parameter variations.

Subsequently, based on actual values of the leakage criteria caused by temperature variations and/or ageing at given run-time conditions for (a subset of) the working points, it is possible to calibrate the trade-off curves and use a run-time controller to select the most suited working points afterward for an actual circuit. These active working points are selected to just meet the necessary system requirements on performance, while minimizing any of the important cost parameters.

Details on how selection of working points is done from the information of said trade-off optimization information, e.g. Pareto-like optimization information, are given in US 2003/0085888.

The invention also includes a program storage device, readable by a machine, tangibly embodying a program of instructions, comprising: selecting working points for at least two tasks from actual measured Pareto-like information.

A second aspect underlying the entire approach is the strict separation of functional and performance/cost issues, e.g. timing/cost issues. The functional correctness is checked by a layered approach of built-in self-test controllers, as described in conventional BIST literature, which check the correct operation (based on test vectors) of the modules. BIST is the technological approach of building tester models onto the integrated circuit so that it can test itself. Checking of the correct operation has to be based on a good knowledge of the cell circuits and DSM technology effects that influence the choice of the test vectors. Furthermore system-level functionality checks may be needed to check that the entire application is working correctly on a given platform. Main system validation should happen at design-time, but if some of the DSM effects influence the way the critical controllers work, then these are better checked at start-up time and/or during run-time to see whether they function correctly.

Effectively dealing with the performance/cost, e.g. timing/cost, variations then, according to the present invention, goes as follows:

At design-time a thorough analysis and exploration is performed to represent a multi-objective "optimal" trade-off point or points, e.g. on Pareto curves, for the relevant cost (C) and constraint criteria. More formally, the trade-off points may e.g. be positions on a hyper-surface in an N-dimensional Pareto search space. The axes represent the relevant cost (C), quality cost (Q) and restriction (R) criteria. Each of these working points is determined by positions for the system operation (determined during the design-time mapping) for a selected set of decision knobs (e.g. the way data are organized in a memory hierarchy). The C-Q-R values are determined based on design-time models that then have to be "average-case" values in order to avoid a too worst-case characterisation.

At processing time, first a run-time BIST manager performs a functional correctness test, i.e. checks all the modules based on stored self-test sequences and "equivalence checker" hardware. All units that fail are deactivated (so that they cannot consume any power any more) and with a flag the run-time trade-off controllers, e.g. Pareto controllers, are informed that these units are not available any more for the calibration or the mapping.

At processing time, also a set of representative working points are "triggered" by an on-chip trade-off calibration manager, e.g. a Pareto calibration manager, that controls a set of monitors which measure the actual C-Q-R values and that calibrates the working points to their actual values. Especially timing monitors require a careful design because correctly calibrated absolute time scales have to be monitored. This can be achieved with techniques similar to the ones described by M. Abas, G. Russell, D. Kinniment in "Design of sub-10-picoseconds on-chip time measurement circuit", Proc. 7th ACM/IEEE Design and Test in Europe Conf. (DATE), Paris, France, February 2004, which techniques make use of an external tester and delay lines.

The above way of working removes the possible negative impact of most of temperature and/or ageing dependent variations in a circuit. As a result the design-time curves come quite close to 'modeling reality', instead of a worst-case approximation, as would be the case in the currently performed approaches. An assumption here is that the relative position and shape of curves formed by the trade-off points, e.g. Pareto curves formed by Pareto points, (the hyper-surface) do not change too much between the "design-time simulation" and the "physically processed chip" version. The absolute values may change drastically but it can be expected that the shape of the curves is quite similar.

In this way, the "stochastic clouds" and the "corner point procedure" that are presently used to have the "worst-case condition" characterization of modules embedded on a system-on-chip (SoC) can be avoided nearly completely. As long as enough redundant units are present (e.g. 20%), the run-time trade-off control manager, e.g. Pareto control manager, can still find a mapping that will meet the constraints for the locations on the SoC that are running under very bad temperature and/or ageing parameter conditions. But for any location (and "time point") where the actual temperature and/or ageing parameters are better, the same constraints will be met with a reduced cost due to the trade-off point curve, e.g. Pareto curve, storage. Due to the use of the step with the self-test controller in a method according to the present invention, also outliers can be handled where the actual temperature and/or ageing parameters are so badly conditioned that the unit is not properly operating any more. Obviously, if the number of faulty units identified with this self-test becomes too high, the yield is too low and hence too few units will be left on the SoC for the run-time trade-off managers, e.g. Pareto managers, to find a valid point/mapping for each constraint set. So the yield should still be somewhat optimized for the given process technology.

Alternatively formulated the present aspect of the present invention can be formulated as follows:

A method for operating a terminal having a plurality of resources (modules) and executing at least one application in run-time, wherein the execution of said application requires execution of at least two tasks, the method comprising selecting a task operating point from a predetermined set of optimal operating points, said terminal being designed to have a plurality of such optimal operating points, said predetermined set of operating points being determined by performing measurements on said terminal.

The invention will be illustrated for a digital audio broadcast (DAB) application but is not limited thereto.

It is an aspect of the invention to provide run-time compensation of temperature and/or ageing variability effects for digital devices.

It is an aspect of the invention to provide a characterization evaluation method for deep submicron devices under temperature and/or ageing variability. The invention will be illustrated for memory modules, in particular SRAMs (static random access memories).

Understanding how temperature and/or ageing variability propagate at the IP block level is important for efficient system level design. The use of the method according to the present invention within system level design methods will be presented also.

In essence a system level design method is provided which can counteract effects caused by temperature variations and/or ageing variations.

The present invention provides a method for generating a run-time controller for an electronic system, said electronic system comprising a run-time controller and an electronic circuit, the method comprising:
generating a first system-level description of the functionality and timing of a simulated electronic circuit;
generating from said first system-level description a second system-level description, including first trade-off information;
generating a run-time performance/cost controller for use with a design for an actual electronic circuit to be manufactured from said second system-level description, said actual electronic circuit, when manufactured, being capable of exploiting said first trade-off information, said actual electronic circuit when operational differing from said simulated electronic circuit due to leakage caused by temperature variations and/or ageing, whereby the run-time controller is adapted to use second actual trade-off information determined from an operational actual electronic circuit.

The difference between the actual electronic circuit and the simulated electronic circuit may include an offset in performance characteristic, e.g. energy or speed, between the actual value and the simulated value. The second system level description can be operable in various working modes, each of said working modes having a unique performance/cost characteristic, said performance/cost characteristics of said working points defining a performance/cost trade-off relationship, said actual electronic circuit being capable of operating under said working modes.

The electronic circuit can be digital or analog or a mixture of the two.

The present invention also provides a run-time controller for controlling an electronic circuit, the controller comprising means for inputting an actual performance constraint based on leakage caused by temperature variations and/or ageing, means for selecting working points on a trade-off performance/cost relationship, based on said actual performance constraint and means for enforcing said selected working point for said electronic circuit.

The present invention also provides an electronic system comprising:
an electronic circuit, including at least one performance and cost monitor, for monitoring performance and cost of operation of the electronic system, and
a run-time performance/cost controller, for selecting working points on a trade-off performance/cost relationship, based on an actual performance constraint based on leakage caused by temperature variations and/or ageing, said run-time controller inputting performance and cost information from said performance and cost monitor.

The present invention also provides a method for generating a run-time controller of an electronic system, the electronic system comprising an electronic circuit comprising a plurality of modules and said run-time controller, the method comprising:
generating a first system-level description of the functionality and timing of a simulated electronic circuit comprising modules;
generating from first said system-level description for at least two of said modules a second system-level description, including first trade-off information;
generating a run-time performance/cost controller for the properly functioning modules of an actual electronic circuit to be manufactured from said second system-level description, said actual electronic circuit, when manufactured, being capable of exploiting said first trade-off information, said actual electronic circuit when operational differing from said simulated electronic circuit due to leakage caused by temperature variations and/or ageing, whereby the run-time performance/cost controller is adapted to use second actual trade-off information determined from an operational actual electronic circuit.

The present invention provides a method for designing an electronic system, comprising a run-time performance/cost controller and an electronic circuit comprising modules, the method comprising:

generating a first system-level description of the functionality and timing of a simulated electronic circuit comprising modules;

generating from first said system-level description for at least two of said modules a second system-level description, including first trade-off information;

generating a run-time performance/cost controller for the properly functioning modules of an actual electronic circuit to be manufactured from said second system-level description, said actual electronic circuit, when manufactured, being capable of exploiting said first trade-off information, said actual electronic circuit when operational differing from said simulated electronic circuit due to leakage caused by temperature variations and/or ageing, whereby the run-time performance/cost controller is adapted to use second actual trade-off information determined from a manufactured actual electronic circuit, and designing an actual digital device from said second system-level description, said actual digital device being capable of exploiting said trade-off information, said actual digital device differing from said ideal digital device due to leakage caused by temperature variations and/or ageing, determining actual trade-off information from said actual digital device, determining which modules of the actual digital device are properly functioning, and generating a run-time performance/cost controller for the properly functioning modules of the actual digital device, said run-time performance/cost controller using said actual trade-off information.

The present invention provides a method for operating an electronic circuit, the method comprising:

loading working points involving trade-offs for criteria related to performance and cost, for an ideal template of said electronic circuit, calibrating trade-off curves based on actual values of the criteria at given run-time leakage conditions caused by temperature variations and/or ageing, loading a performance constraint and selecting a best suited working point in view of said performance constraint.

Selecting a best suited working point may comprise selecting working points so as to just meet necessary requirements on performance, while minimizing at least one of the cost criteria.

The method may comprise loading working points involving trade-offs for criteria related to performance and cost, for an ideal template of said electronic circuit, calibrating trade-off curves based on actual values of the criteria at first run-time leakage conditions caused by temperature variations and/or ageing, loading a performance constraint and selecting a first best suited working point in view of said performance constraint, and thereafter calibrating trade-off curves based on actual values of the criteria at second run-time leakage conditions caused by temperature variations and/or ageing and selecting a second best suited working point in view of the performance constraint. The recalibration at second run-time leakage conditions caused by temperature variations and/or ageing may be performed in order to follow up load changes due to temperature variations and/or ageing.

The present invention also provides a machine-readable program storage device embodying a program of instructions for execution on a processing engine, the program of instructions defining a run-time performance/cost controller for an electronic system, said electronic system comprising a run-time performance/cost controller and an electronic circuit, the program instructions implementing:

generating a first system-level description of the functionality and timing of a simulated electronic circuit;

generating from said first system-level description a second system-level description, including first trade-off information;

generating a run-time performance/cost controller for use with a design for an actual electronic circuit to be manufactured from said second system-level description, said actual electronic circuit, when manufactured, being capable of exploiting said first trade-off information, said actual electronic circuit when operational differing from said simulated electronic circuit due to leakage caused by temperature variations and/or ageing, whereby the run-time performance/cost controller is adapted to use second actual trade-off information determined from an operational actual electronic circuit.

Particular and preferred aspects of the invention are set out in the accompanying independent and dependent claims. Features from the dependent claims may be combined with features of the independent claims and with features of other dependent claims as appropriate and not merely as explicitly set out in the claims.

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 7 illustrates a design-time algorithm for temperature-dependent leakage reduction.

FIG. 8 illustrates a run-time calibration algorithm for handling of leakage caused by temperature variations and/or ageing.

FIG. 9 illustrates a run-time algorithm for temperature-dependent leakage reduction.

FIG. 10 illustrates a design-time algorithm for temperature-dependent leakage reduction in case of reduced flexibility in the mapping.

FIG. 11 illustrates a run-time algorithm for temperature dependent leakage reduction in case of reduced flexibility in the mapping.

DESCRIPTION OF ILLUSTRATIVE EMBODIMENTS

Figure 1:
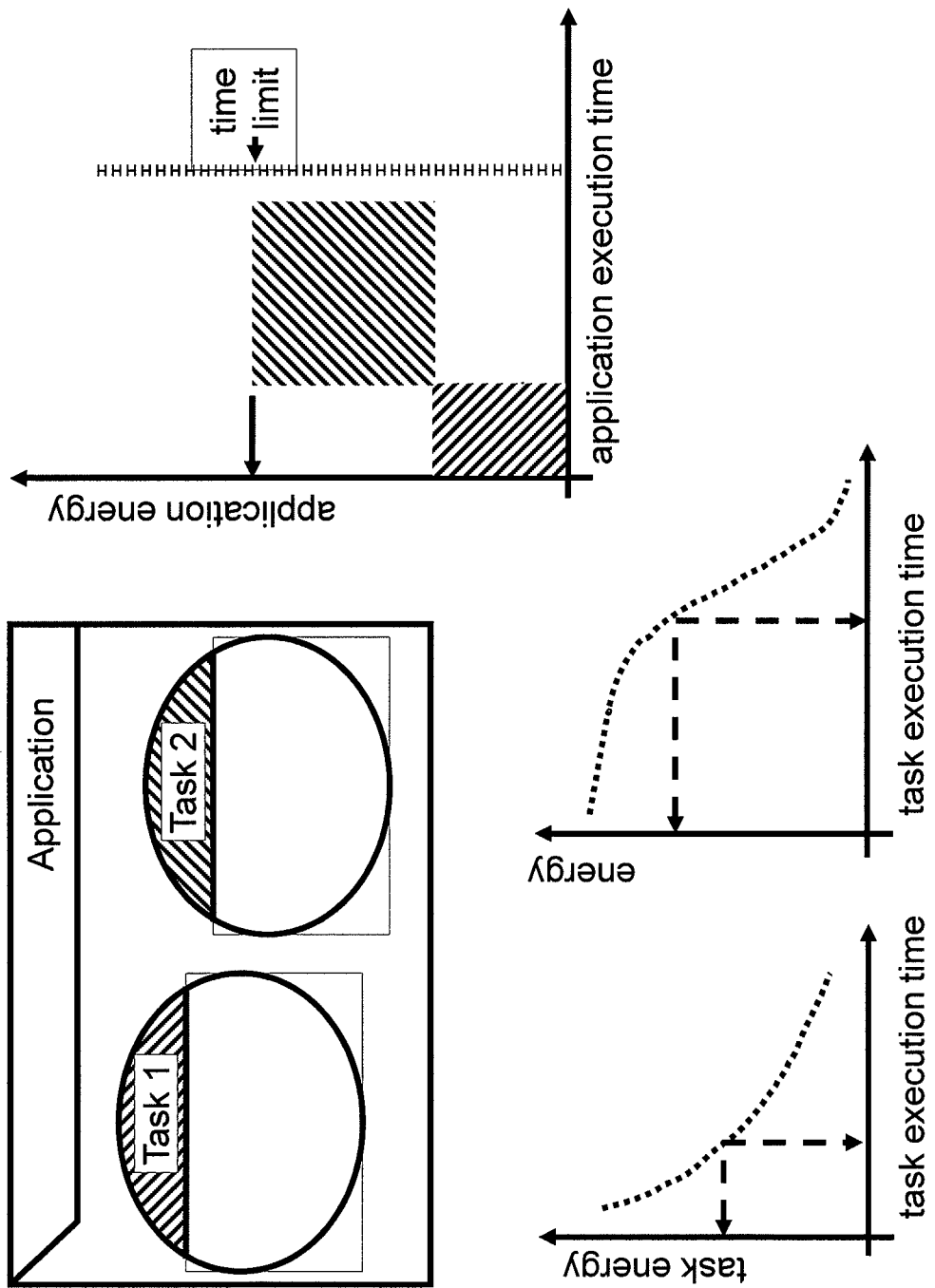
FIG. 1 illustrates the design-time/run-time principle according to an embodiment of the present invention, whereby an original run-time example is shown.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "coupled", as may also be used in the claims, should not be interpreted as being restricted to direct connections only. Thus, the scope of the expression "a device A coupled to a device B" should not be limited to devices or systems wherein an output of device A is directly connected to an input of device B. It means that there exists a path between an output of A and an input of B which may be a path including other devices or means.

The invention will now be described by a detailed description of several embodiments of the invention. It is clear that other embodiments of the invention can be configured according to the knowledge of persons skilled in the art without departing from the true spirit or technical teaching of the invention, the invention being limited only by the terms of the appended claims.

The invention may exploit, in one aspect, the system-wide design-time/run-time (meta) Pareto approach as described in US 2002/0099756 (task concurrency management), US 2003/0085888 (quality-energy-timing Pareto approach), EP 03447082 (system-level interconnect). Alternatively, the invention may exploit another trade-off approach.

It is clear that everything should be done to reduce internal or non-leakage power consumption, also called useful power consumption (abbreviated as Puse further on) to a very low amount. This will allow keeping the temperature of a chip very close to room temperature. Assuming that the user of a portable equipment does not keep all the time in the sun or another too hot environment, it can be assumed that the package will be between 20 and 40 degrees. At that level, the temperature difference with reference to the internal die can be assumed to be not much higher (with zero leakage) if the internal power consumption Puse is not too high. And if the internal temperature is low, the leakage itself will hardly contribute. Future work will have to indicate which internal power consumption values Puse are compatible for a given package with such a low internal temperature.

The next question is how to ensure that the internal power consumption Puse for any part of the chip will remain very low so that no hot spots occur where the temperature rises locally (with the leakage spiral as a consequence).

According to the present invention, a run-time "module" assignment strategy is provided to the different components on the die which monitors the temperature and/or ageing, and based on that assigns the next processing task to the appropriate processing unit that has enough "temperature and/or ageing slack" (and corresponding leakage power consumption Pleak) and that is suited to execute that task with an acceptable internal power consumption Puse. But trade-offs are possible here because the best-suited unit (with the lowest cost, e.g. internal power consumption Puse) will not necessarily be the one that has a good, i.e. low, leakage power consumption Pleak. So a global assignment problem has to be solved at run-time. Obviously, that is in general impossible, but thanks to the design-time/run-time Pareto approach according to the present invention a practically implementable solution can be found. Indeed, this approach imposes that at design-time the different internal power consumption values Puse and temperature or ageing-dependent power consumption values Pleak for that task have already been precalculated on all the "suitable" units. Furthermore, also the consequence on the performance, e.g. execution time (to still meet overall timing constraints), is prestored in the Pareto curves for the task. So the run-time Pareto-based performance/cost controller in the TCM stage should then "just" be extended to also add the temperature and/or ageing information so that a "global" assignment can be done where also the leakage power is included in the optimization.

The approach of the present invention is thus to explicitly exploit a variation in system-level mapping to increase the overall cost/performance efficiency of a system.

A difference between the method of the present invention compared to existing approaches is that the existing prior art methods try to monitor the situation and then "calibrate" a specific parameter. But in the end only one "working point" or "operating point" is present in the implementation for a given functionality. So no "control knobs" (control switches or functions) are present to select different mappings at run-time for a given application over a large set of heterogeneous components. The mapping is fixed fully at design-time. Moreover, the functional and performance requirements are both used to select the "working" designs/chips from the faulty ones. So these two key requirements are not clearly separated in terms of the test process.

An example is shown in FIG. 1 where there are originally two active entities (or tasks in this case), task 1 and task 2. Each of them has a trade-off curve, e.g. Pareto curve, showing the relationship between performance, in the example given task execution time, and cost, in the example given task energy. On each of these trade-off curves a working point has been selected for the corresponding task, so that both tasks together meet a global performance constraint, in the example given a maximum "time limit" on the application execution time for the target platform (top right). The working point, e.g. Pareto point, for each task has been selected such that the overall cost, in the example given application energy, is minimized.

Figure 2:
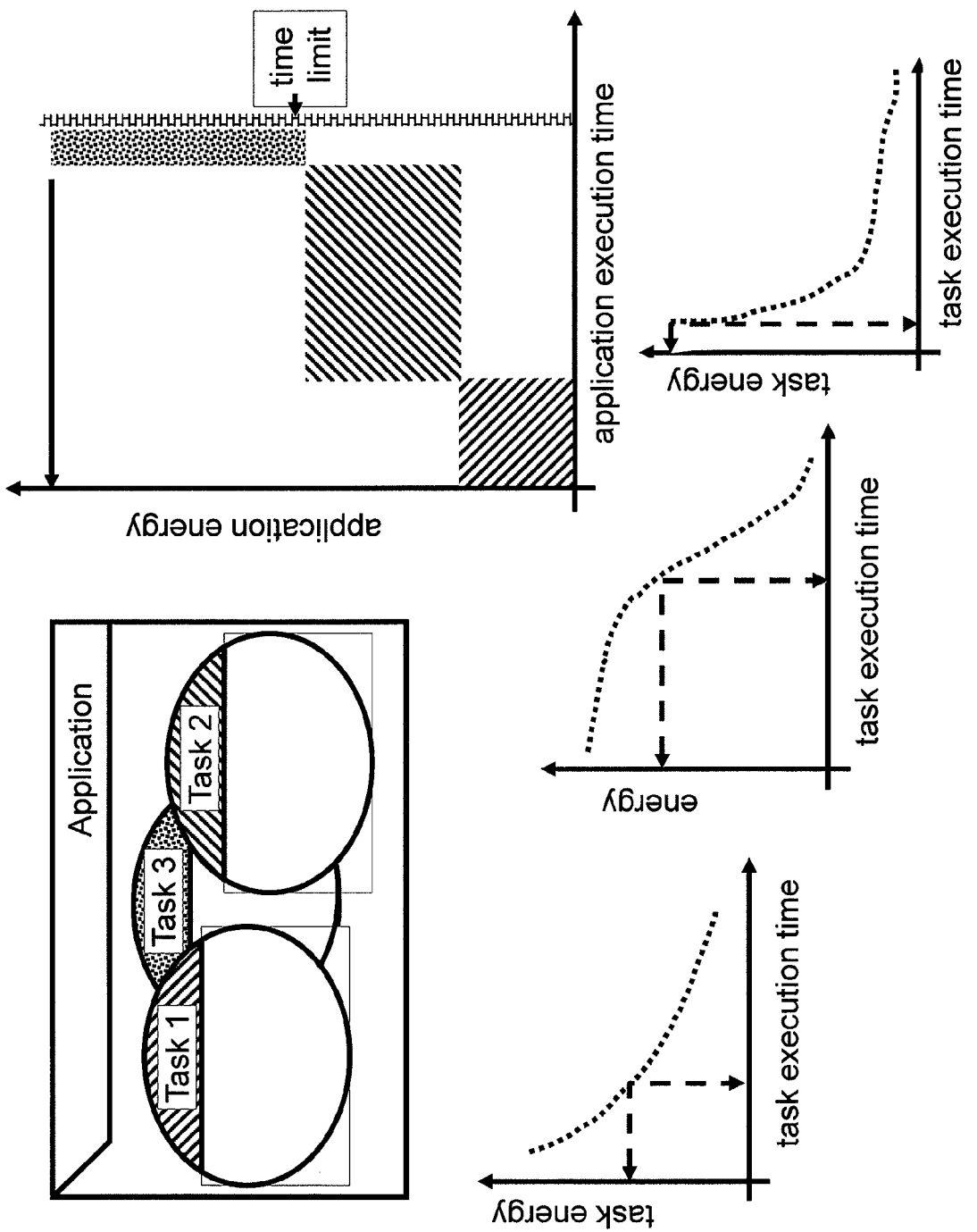
FIG. 2 illustrates the design-time/run-time principle according to an embodiment of the present invention, whereby an unoptimized run-time example is shown.

When a third task, task 3, now enters the system and it has to be mapped on the same platform resources, sufficient time has to be created for it. If the working points, e.g. Pareto points, (mappings) of the already running tasks task 1 and task 2 cannot be changed, a very energy-costly overall solution is obtained, as indicated in FIG. 2. Indeed, only a very small slack is still available within the time limit (top right).

Figure 3:
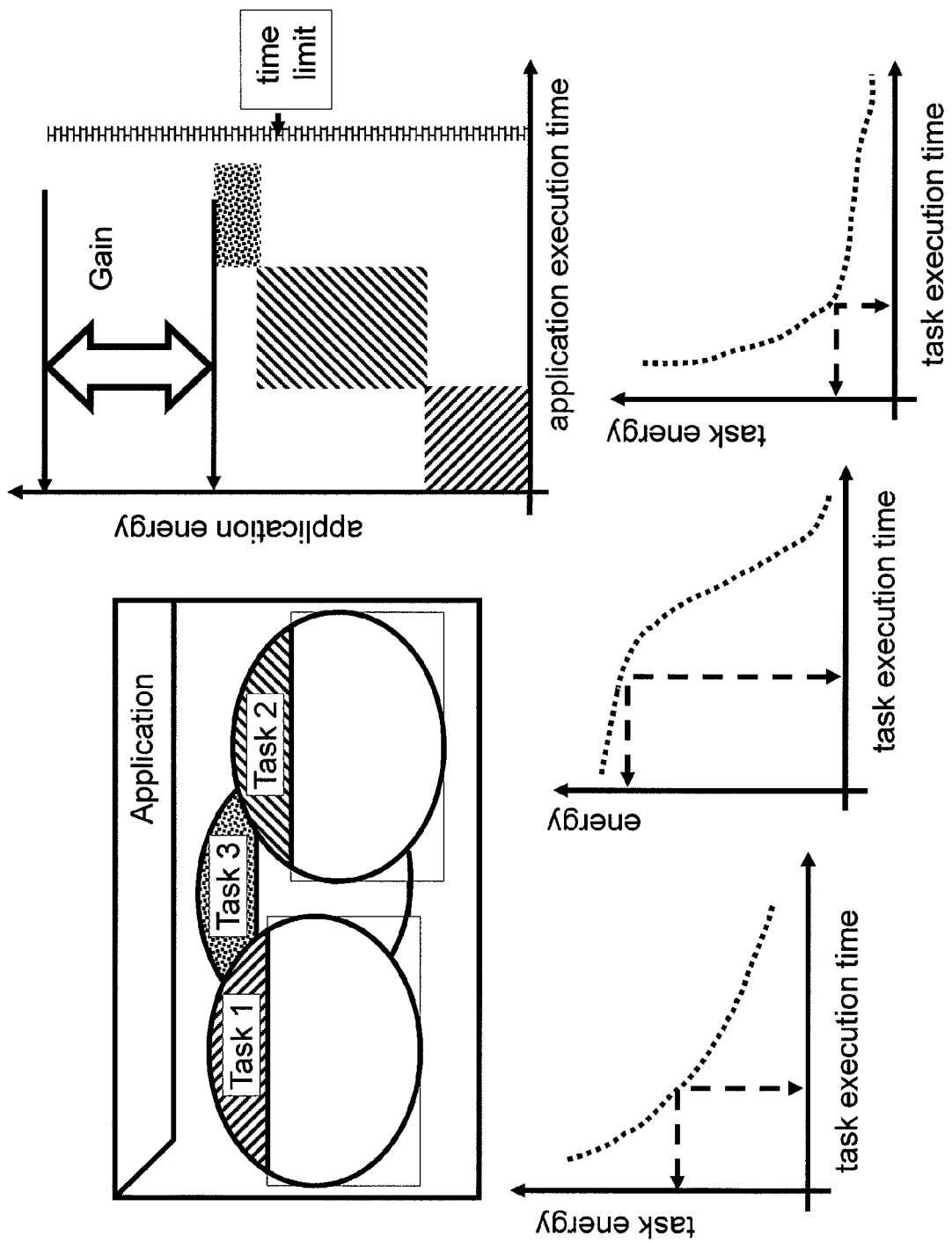
FIG. 3 illustrates the design-time/run-time principle according to an embodiment of the present invention, whereby an optimized run-time example is shown.

However, if the working point, e.g. Pareto point, for any of task 1 or task 2 can be changed, e.g. the working point for task 2 can be changed, then sufficient slack is created for task 3 to select a much less energy costly point (see FIG. 3). The overall application energy now exhibits a considerable gain—the gain indicated in FIG. 3 is the difference between the cost in the situation of FIG. 2 compared to the cost in the situation of FIG. 3, while the application still meets the overall execution time limit on the given platform.

Figure 4:
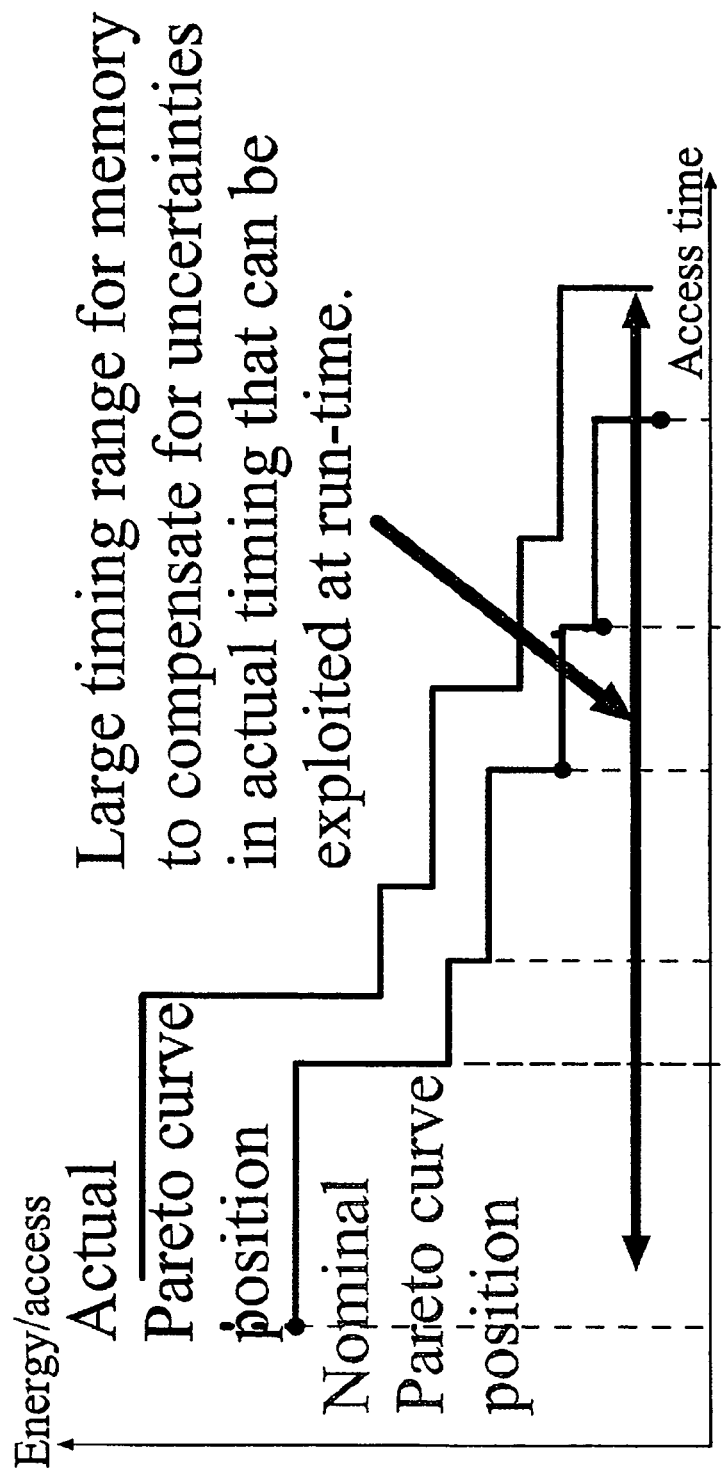
FIG. 4 illustrates designed and actual Pareto curves with cost (energy) versus performance (time) for a given module/component, the component being a memory in the example given. All non-optimal points can be discarded at design-time. The timing range can be exploited to compensate for uncertainties due to leakage caused by temperature variations and/or ageing.

When dealing with performance/cost issues, e.g. timing/cost issues, it is assumed that a large performance range, e.g. a large timing range, is available in the trade-off curve, e.g. Pareto curve (as illustrated in FIG. 4, where performance/cost ratio is exemplified by access time/energy consumption ratio). Such large performance range can be achieved by a proper exploration/design/analysis phase at design time. This range will allow, according to the present invention, to compensate at run-time any performance uncertainties or variations, in the example given timing uncertainties or variations (whether they are spatial or temporal does not matter) as long as they are smaller than half the available range. It is to be noted that this approach does not only deal with performance uncertainties due to leakage caused by temperature variations and/or ageing but also due to higher-level variations, e.g. due to a circuit malfunction (which changes performance, e.g. timing, but not the correct operation) or even architecture/module level errors (e.g. an interrupt handler that does not react fast enough within the system requirements). As long as the working range on the performance axis has enough points available to compensate for the lack of performance, e.g. "lack of speed", compared to the nominal point, these variations can be compensated for at run-time.

As can be seen from FIG. 4, at design time a nominal trade-off curve, e.g. a nominal Pareto curve, can be established, giving a relationship between performance and cost, in the example given in FIG. 4 a relationship between memory access time and energy consumption. The nominal trade-off curve, e.g. Pareto curve, can be stored, e.g. in a Pareto point list stored in a table. During actual use of the circuit, an actual trade-off curve, e.g. Pareto curve, can be established, which may differ from the nominal trade-off curve due to leakage caused by temperature variations and/or ageing.

Any uncertainty in the actual timing of the circuit due to leakage caused by temperature variations and/or ageing during operation can be compensated by shifting to another point on the "actual" trade-off curve, e.g. Pareto curve. The range for compensation equals the performance range, e.g. the entire time range, of the actual trade-off curve that can be designed such that it is larger than any of the potential uncertainties during operation. It is to be noted though that the position of the new working point, i.e. the points on the actual trade-off curve, can differ quite a bit during operation. Moreover, some of the original points on the nominal trade-off curve could move to a non-optimal, e.g. non-Pareto optimal, position during operation. In that case, they are removed from the nominal trade-off curve as stored, e.g. the Pareto point list stored in tables.

In order to reduce the risk of not having enough valid trade-off points, e.g. Pareto points, during operation, the original trade-off curve is preferably provided with an offset e.g. a so-called "fat" Pareto curve is established, which means that additional working points are added to the module that are initially above the trade-off curve, e.g. Pareto curve, but that have a high sensitivity (in the "beneficial direction") to parameters that are affected by leakage caused by temperature variations and/or ageing. So these working points are likely to move to a more optimal position during operation. The best suited number and position of additional points in the trade-off curve with an offset, e.g. fat Pareto curve, can be decided at design-time by analysis of a well-matched leakage caused by temperature variations and/or ageing model. A trade-off is involved between extra overhead due to storage of the additional points and the possibility to more optimally compensate for leakage caused by temperature variations and/or ageing. It is to be noted that even if the available range becomes relatively small compared to the initially available range, the different global mapping of the application over all working modules will still allow compensating for that limited range. This remains true as long as sufficient working modules with a sufficient timing range are available in the overall design. So some redundancy should be provided in the number of components that is initially instantiated on the system/SoC.

In this way, substantially no slack or even no slack at all has to be provided any more in the tolerances for the nominal design on the restricting criteria (e.g. data rate or latency), and hence the likelihood of a significant performance and/or cost gain is high with the approach according to the present invention. In the (unlikely) very worst-case, the performance is still as good as the conventional approach can provide. This is based on the "robustness" of a run-time trade-off controller, e.g. Pareto controller (see below), to modifying the position of the trade-off curves, e.g. Pareto curves, even at run-time.

So the approach according to embodiments of the present invention involves a significant generalization of the current "run-time monitoring" approaches, transposed in a digital system design context, where the monitored information is used to influence the actual settings of the system mapping. Furthermore, also a practically realizable implementation is proposed of the necessary "timing compensation" that is needed in such a system-level feedback loop.

Operation Phases

According to embodiments of the present invention, the operation of a system is divided into three phases, namely a measurement phase, a calibration phase and a normal operation phase. During the measurement phase the characteristics of the circuit, e.g. all memories, are measured. In the calibration phase a leakage (LC) selects the appropriate configuration-knobs for the circuit, and applies them directly to the circuit. The phase of normal operation is for executing the target application on the platform.

In the explanation given hereinafter, reference is made to memories; however it is to be understood that this is as an example only, and is not intended to be limiting. Where "memories" has been written, the broader notion of circuit has to be understood. Memories are only one type of circuits which are particularly susceptible to leakage caused by temperature variations and/or ageing.

Measurement Phase

During the measurement phase the cost is measured in function of performance of the circuit.

For example in case of a memory organization, energy consumption per access (cost) and the delay (performance) of each memory in the organization are to be measured. Therefore, each memory in the memory organization may be accessed a pre-determined number of times, e.g. four times, to measure read and write performance of a slow and a fast configuration. All these performance values for delay and energy consumption of a memory need to be updated in the LC for each memory in the system. Furthermore for all of these pre-determined number of measurements (e.g. slow read; slow write; fast read; fast write) the worst-case access delay and energy of each memory needs to be extracted. A methodology for doing this may be similar to the one proposed in H. Wang, M. Miranda, W. Dehaene, F. Catthoor, K. Maex, "Systematic analysis of energy and delay impact of very deep submicron process variability effects in embedded SRAM modules", accepted for 2005. According to this methodology, test vectors are generated based on two vector transitions that can excite the memory addresses that exhibit the worst-case access delay and energy consumptions. These test vectors are generated in a BIST-like manner. Furthermore a memory has also different delays and energy consumptions for each of its bit- and wordlines. Therefore the worst-case access delay and energy consumption have to be calculated. This calculation is done already within monitors or monitoring means (see below) and so only the worst-case values have to be communicated over the network.

Figure 5:
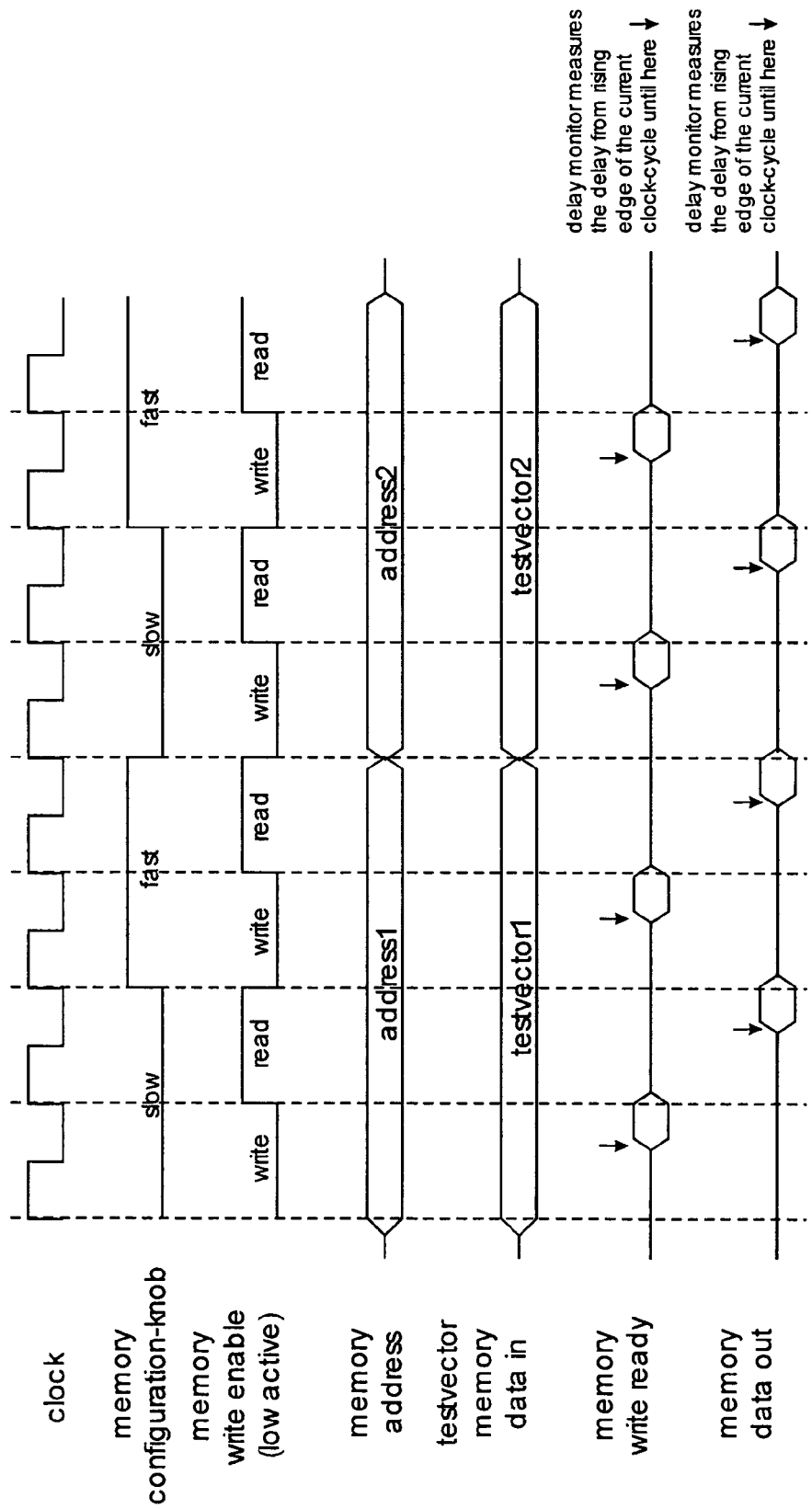
FIG. 5 shows measurement of access delay for two testvectors and two addresses on one memory.

In the beginning of this measurement phase the LC reads a first test vector from a test vector memory and configures the network in order to be able to communicate with the memory under test. Also delay and energy monitors are connected to the memory which is currently under test. The functional units of the application itself are decoupled from this procedure. Then the LC applies a test vector including address and data to the memory. In a first step the memory is written and so the ready bus of the memory is connected to the delay monitor. The time to apply one test vector to the memory is equal to one clock-cycle. For measurement the clock is configured via a phase-locked-loop in a way that the monitors have a stable result before the beginning of the next clock-cycle. In the next clock-cycle the memory is read from the same address as before, so the same test vector is still in use. In this cycle the data-out bus of the memory is connected to the delay monitor in order to measure the time after which the output of the memory is stable. In a third step the memory configuration-knob is changed from slow to fast which means that the memory is now configured to its faster and more energy consuming option. Still the same test vector is applied and step one and two are repeated for the fast configuration-knob of the memory under test. These four steps which are described in FIG. 5 are repeated for all test vectors of the memory under test.

After all the test vectors for the currently measured memory are applied, the delay and energy monitors send back the maximum delays and energy consumptions of all pre-determined, e.g. four, possible options of this particular memory under test. The pre-determined number, e.g. four, maximum delay and maximum energy consumption values (e.g. each for slow read, slow write, fast read and fast write) are stored into a register file within the LC in order to be able to decide during the calibration phase which configuration of the memory has to be chosen.

All these steps are repeated for each memory in the system and so finally all the maximum delays and energy consumptions of each memory are known by the LC.

It is clear that the measurement phase is a rather tedious and time-consuming procedure. The total number of words which have to be accessed in a system using the DAB receiver as illustrated below is 23552. Assuming that energy measurement takes the same amount of cycles as the delay measurement which was described above the measurement phase for this system requires 188512 cycles. It may be performed every time the system starts up, if the temporal effects due to leakage caused by temperature variations and/or ageing, related to reliability for instance, can be assumed to be very slow. On the other hand, if the temporal effects due to leakage caused by temperature variations and/or ageing are considerable in time, then the measurement phase may be performed several times during operation.

After all memories have been measured, the LC tells the system-level-controller that the measurement phase is finished. The system-level-controller is now the one which has to decide how to proceed. Usually it decides now to proceed with the calibration phase, in which the most efficient memory configuration for the system in view of the actual leakage conditions caused by temperature variations and/or ageing has to be found.

Calibration Phase

During the calibration phase, the LC configures the memories of the system in order to meet the actual timing requirements of the application. Therefore the LC uses dedicated control lines which are connected to each memory of the architecture. Calibration may be performed once at start-up, or calibration may be performed a plurality of times during operation of the circuit. For example a first calibration may be carried out for a first performance constraint, and recalibration may be carried out for a second, different, performance constraint. Recalibration may also be carried out for following up changes in parameters due to leakage caused by temperature variations and/or ageing, depending on what the actual loading is.

Apart from the information about performance and cost, e.g. delay and energy, of each memory, which information was stored during the measurement phase, the LC holds information about the current timing constraint for the specific application. This timing constraint is also stored in a register and can be changed at run-time, if the register is memory-mapped. The timing constraint is generated during the design-time analysis of the application according to the bandwidth requirements of the application.

The LC is calculating all necessary information to configure the configuration-knobs of the memories in order to meet the timing constraint. These calculations are depending on the adaptation the controller operates on. In clock-cycle-level adaptation the controller will only decide based on the configuration-knobs the memories are providing. In time-frame-level adaptation the controller is providing more accurate configurations gained from the fact that the application is time-frame based and the functional units are executed sequentially. Based on the information gained with one of the two approaches the most efficient configuration for the memory configuration-knobs in terms of performance and cost, e.g. delay and energy, is applied.

Normal Operation

Normal operation is the phase where the target application is executed on the functional units of the platform. All other components like the LC and the energy and delay monitors are virtually hidden by an appropriate configuration of the communication network. During this phase the memory management unit of the functional units takes care of supplying the source and destination block information to the network.

Figure 6:
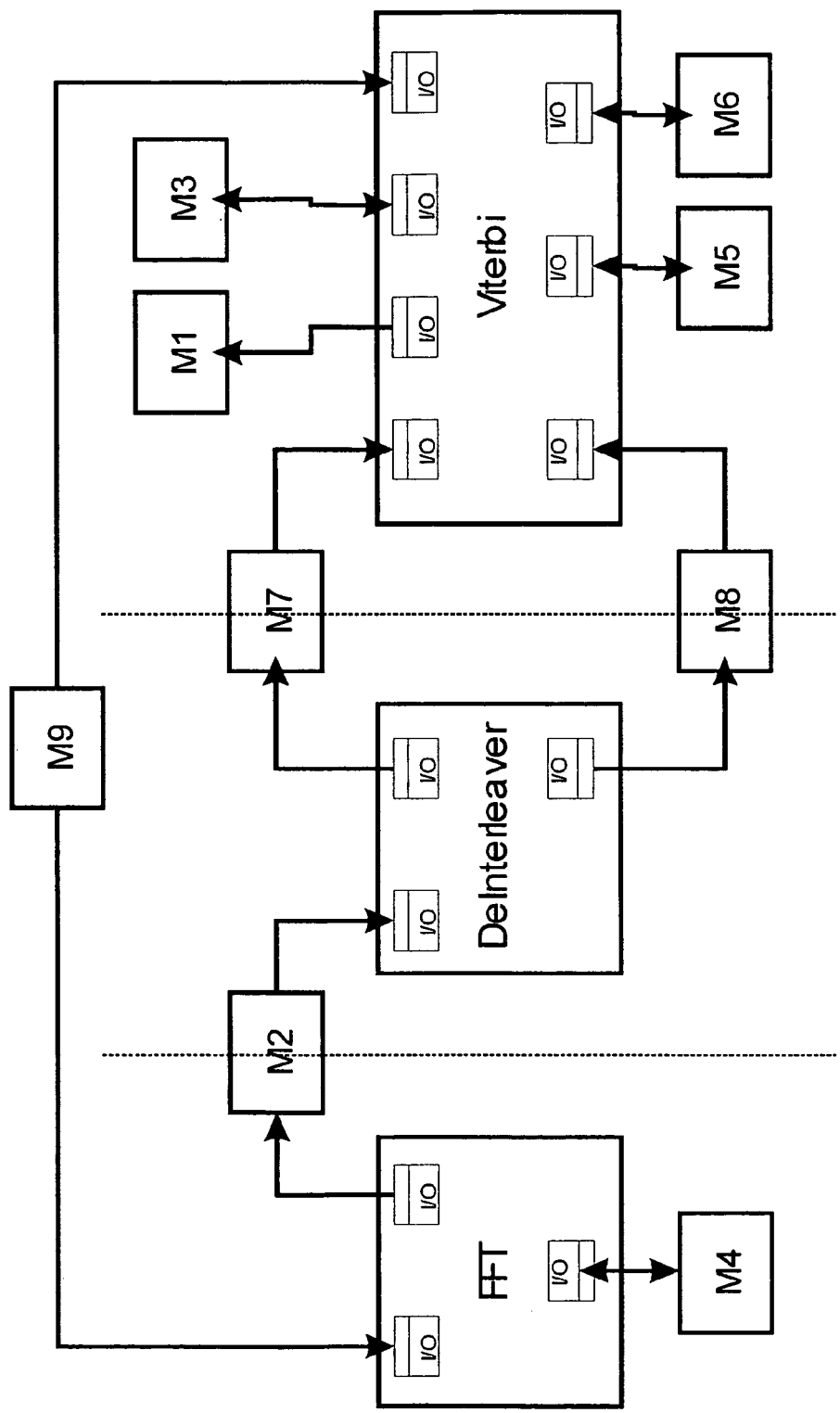
FIG. 6 illustrates the functional units of the application mapped to their dedicated memories.

In the case study with the DAB receiver (see below) which was implemented this memory management unit of the functional unit was implemented within the system-level-controller. The functional units themselves were abstracted away by simulating their I/O behavior. So the functional units themselves are implemented as a Finite State Machine which communicates in a cycle-accurate behavior with the memories. The memory accesses in normal operation mode are simulated by the three different Finite State Machines which are representing the FFT, the Deinterleaver and the Viterbi of the application driver. FIG. 6 shows the different memories and their corresponding functional unit. The memory accesses were simulated by using this scheme.

Algorithms

A conceptual algorithm for the design-time, calibration-time and run-time phases of this scheme is shown in FIG. 7, FIG. 8 and FIG. 9 respectively.

A same story applies for the assignment of data memory accesses to the memory units in the hierarchical data memory organization, and even of the code segments to the L0 buffers in the hierarchical code memory organization. Alternatively this could even be done for the transfers in the communication network. Hence, in the conceptual algorithm the term "elements" is used for the design-time/run-time mapping decision. These can be data arrays, instruction code segments, subtasks (or operation clusters) and even transfer blocks.

It is to be noted that this procedure is performed for relatively large system modules, so not for individual devices or even small circuits. Otherwise the overhead would be too large. But for the present invention, that granularity is also sufficient to deal with the issues addressed here. The effect of leakage caused by temperature variations and/or ageing on the correct operation of the individual devices should be taken care of during the circuit design stage itself (i.e. sufficient tolerance should be built in to keep on operating at least in a reasonable way). What is desired to deal with here are the overall C-Q-R (cost, quality, rate) axes that also influence the "correct operation" but from the system level point of view.

It is also to be noted that the monitors and the stored C-R-Q values in the trade-off surfaces, e.g. Pareto surfaces, do not have to be extremely accurate because the trade-off run-time controllers, e.g. Pareto run-time controllers, are quite "robust" to (small to medium) errors. The reason is that if at run-time a too optimistic/pessimistic point is selected at time $T_i$, the next evaluation at time $T_{i+1}$ it shall "notice" that too much/little slack is created compared to the actually imposed constraints. As a result, the trade-off control manager, e.g. Pareto control manager, can relax the trade-off working point, e.g. Pareto working point, to one of the "neighboring" points on the trade-off surface. Under the constraints defined by control theory a system is robust as long as the errors are not leading to a positive feedback control loop. Given that the trade-off control manager should be activated frequently enough so that all "external" events are "sampled" enough, this assumption should be valid even for errors up to a few 10s of percent. Obviously, it will not work for 100's of percent but that is avoided by the above procedure.

Mapping tools are provided which include a good temperature or ageing-dependent leakage model for the components. Further these tools can include heat diffusion models so that the expected temperature raise or ageing dependence can be computed for a given internal power consumption $P_{use}$ of a particular component, and this across the rest of the chip.

In some circumstances the heat is not quickly spreading over a chip. So if one module becomes very hot, it remains so for some time and it takes a long time before also the "neighbors" are affected.

In other circumstances "spacing" can be provided between components to avoid a too large heating effect from the neighbors. The open space created this way is not necessarily fully lost because it can be tried to optimize the placement of the different module types so that they are anyway interleaved in terms of operation, so that the neighboring modules are in "full power down" mode while a given module is heating up. By a good floorplanning, the "open" space which is present in any floorplan of macroblocks can also be distributed to the modules that need the space most.

FIG. 7 describes the design-time phase, generating so-called design trade-off information, e.g. Pareto information. FIG. 8 describes the calibration phase, determining so-called actual trade-off information, e.g. actual Pareto information, and the run-time phase, exploiting said actual trade-off, e.g. Pareto, information. The addition of the calibration phase is known in previous design-time run-time Pareto approaches. Also the deactivation of failing circuitry within the design digital system (being multi-module) is an additional feature.

In case of no application specific mapping tool can be used the following approach is still possible.

On some platforms, the vendor will not have full control on the mapping environment that designers use for their applications. In that case, it is not possible to incorporate the design-time exploration phase (which is application-specific) in the design/tool flow.

In order to still allow some savings, one could however use the following scheme. It is now assumed that the platform vendor is still prepared to include a heterogeneous distributed memory organization on the platform. Obviously, the following scheme is also only useful if that memory organization incurs a dominant/significant part of the leakage and if its temperature and/or ageing is mainly induced by the activity (dynamic+leakage power) on these memories.

The mapping environment or the designer himself will then still perform a specific assignment of the data to the circuit, e.g. memories. It is assumed that this assignment is expressed to a tool that converts this to a table that is stored in the program memory organization of the embedded processor that executes the run-time trade-off, e.g. Pareto, controller dealing with the temperature or ageing dependent leakage reduction handling. This run-time trade-off controller, e.g. Pareto controller, will 'redo' the assignment based on the currently available space in the distributed memories and based on their temperature or ageing. That makes the complexity of the run-time trade-off controller, e.g. Pareto controller, larger because it also has to keep track of which space is occupied or not and it will also affect how global the optimization can work.

The same concept can be applied for subtasks on processors or code segments on instruction memory hierarchy or block transfers on the communication network.

A conceptual algorithm for the revised design-time, calibration-time and run-time phases of this scheme is shown in FIG. 10, FIG. 8 and FIG. 11 respectively. In essence the remaining flexibility in the platform at hand is exploited as much as possible, hence a simplified design-time phase is used, shifting some more effort to the run-time mapping.

In summary the invented approach splits the functional (which modules works) and performance/cost aspects of a part or the entire application mapping/platform design process.

Further the design essentially digital systems will include additional monitors for the C-R-Q axes, but since they are executed very infrequently, the energy overhead should be low.

The invention will work properly if the trade-off, e.g. Pareto, hyper-surface retains the same shape from the design-time simulation to the physical processed one (which can partly be included as a design criterion). If the change is too large, the use of a trade-off curve with offset, e.g. a so-called "fat Pareto curve", (incorporating non-optimal working points in the design trade-off curve lying within a predetermined offset of the optimal points) can be used to compensate for small shape changes.

As an example, an application on a memory device is now given in more detail.

The impact of leakage caused by temperature variations and/or ageing on transistors is straightforward. A transistor can become faster or slower, the threshold voltage can be shifted, etc. However, the nominal point will normally be relatively well centered in the middle of a "variation cloud". The impact on a memory is much more complex though. This is illustrated in the variation clouds for read and writes for a high-performance and a low-energy memory (read operation illustrated in FIG. 12 and write operation in FIG. 13). For larger memories the range of these clouds increases, as decoder and sub-array sizes also tend to increase.

Memory matrices are complicated circuits, containing analog and digital parts. For small memories, the decoder consumes a significant part (over 50%) of the delay and energy. Moreover, in the memory matrix itself, the bitlines consume potentially much more than the sense amplifier (SA) because the SA is only active for e.g. 32 bits, whereas the bitlines span 128 bits (even in a divided bitline memory the bitlines span more than 1 word). Both components will now be analyzed. In one of the largest digital circuits of a memory, the decoder, leakage caused by temperature variations and/or ageing always degrade delay, because many parallel outputs exist and the decoder delay is the maximum of all the outputs. The "nominal" design is the fastest because all paths have been optimized to have the same "nominal" delay. However, under leakage caused by temperature variations and/or ageing, the chance of having one of these outputs reacting slower than the nominal one is very large. On the other hand, decoder energy is also degraded because the differences in the delays create glitches and this leads to energy overhead. The number of glitches is always larger than the in the (well optimized) nominal design hence also the "wasted" energy on these.

The analog parts of the memory (cell array and sense amplifier) are also heavily affected by leakage caused by temperature variations and/or ageing. The delay is normally increased because several bitlines are read/write in parallel to compose a memory word. If, due to leakage caused by temperature variations and/or ageing, the driving capability of one of these cells decreases, then during the read operation the swing in voltage in the affected bit-line will be less in magnitude than in the nominal case. In this case the sense amplifier will require more time to "read" the logic value than nominally. Indeed, it would be necessary to have all active cells in the selected word to have a higher driving capability than the nominal one and that one to be larger than the delay occurring in the decoder so as to have a memory operation faster under leakage conditions caused by temperature variations and/or ageing than in nominal operation. The chance of having this situation is indeed very small, due to the typical large bitwidth (more than a byte) and the importance of the decoder both in energy and delay for small memories. Similar things happen during the write operation where besides the write circuit, the driving capability of the cell is also involved.

Figure 12:
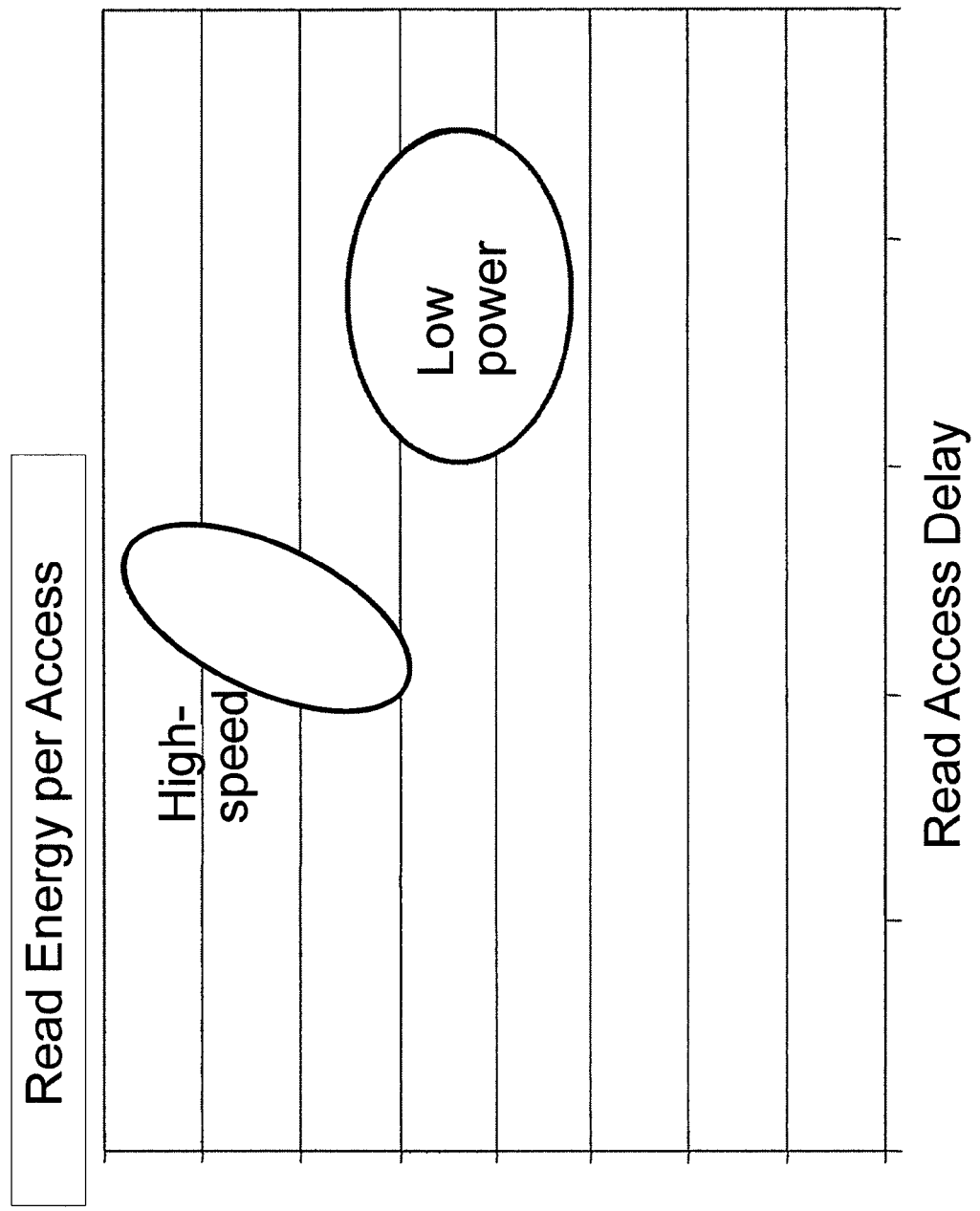
FIG. 12 illustrates the spread due to leakage caused by temperature variations and/or ageing on energy/delay characteristics during read operations for a memory. Two options are provided: high speed and low power.
Figure 13:
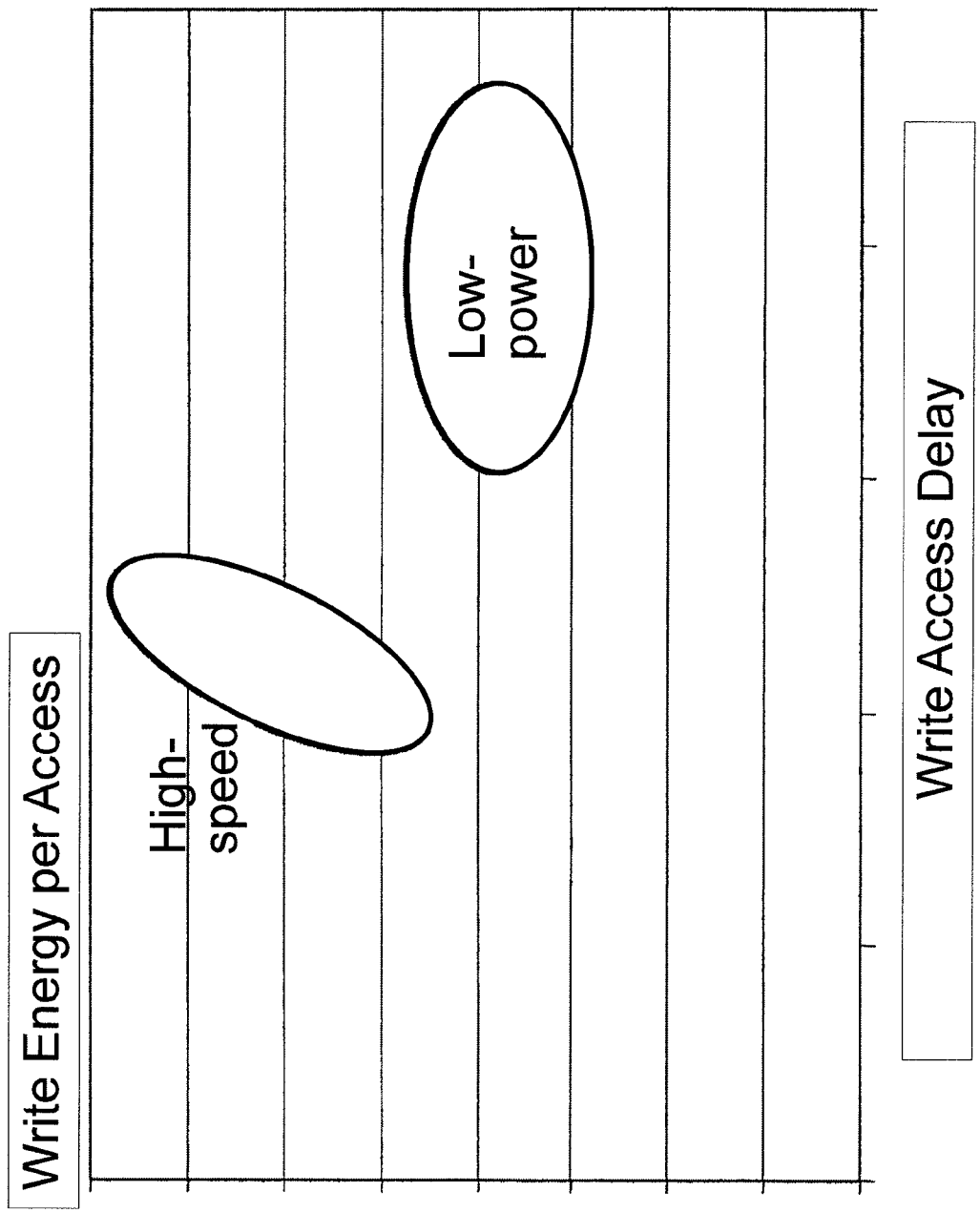
FIG. 13 illustrates the spread due to leakage caused by temperature variations and/or ageing on energy/delay characteristics during write operations for a memory. Two options are provided: high speed and low power.

For the energy the story is more complex. Due to the dominance of the memory matrix, it is now possible that energy is gained, namely when the swing becomes smaller in most active (accessed word in selected word-line) and non-active (non-accessed words in selected word-line) bit-lines. Hence, due to the smaller swing in these bit-lines the dynamic energy spent during the read operation in the memory matrix is less than in the nominal case. In that case, even when the sense amplifier (SA) has to spend more effort to detect the bit (it will take longer), the increase in energy in the SA is usually not enough to compensate for the decrease in energy the bitlines. So overall the memory matrix energy will have a good chance of an energy gain. Overall, the cloud is shifted mostly towards worse energy but a small part of the points exhibit a gain (FIG. 12+FIG. 13). Finally, leakage caused by temperature variations and/or ageing also has an important impact on the timing control interfaces that determine when the decoder has finished and the SA can be activated. This can additionally create yield problems.

Since leakage caused by temperature variations and/or ageing make memories slower and usually also less energy-efficient, the impact on the system will be similar. The total system energy is the sum of the memories' energy weighted by the number of accesses to each of them. Preferably this should be separate for the reads and writes because they have different behavior (see FIG. 12+FIG. 13). The system delay is the worst case delay of all the memories that are active, since all memories should be able to respond in one clock cycle. If leakage caused by temperature variations and/or ageing cannot be compensated for at run-time, a worst-case is to be assumed at the design-time characterization. Obviously not all extreme delay values can be counteracted, so typically a 3 sigma range is identified. This will determine a yield value after fabrication during the test phase, because all the points beyond 3 sigma range will be invalid.

In deep-deep submicron technologies, the yield problems are significant so vendors are moving to 6 sigma range for SRAMs. This makes the energy loss to meet a given delay requirement even larger compared to the typical/most likely "actual" points in the cloud.

The impact of leakage caused by temperature variations and/or ageing on the system energy consumption should be on average equal to that on the memories. If, for example, the memories consume 10% on average more energy due to leakage caused by temperature variations and/or ageing, the system will also consume 10% more on average. On the other hand, delay will be significantly degraded with a very large probability, due to its nature. If leakage caused by temperature variations and/or ageing makes one memory much slower, then the entire system has to follow and slow down significantly. This makes the loss of system energy to guarantee (within 6 sigma) a specific clock delay requirement at the system level even larger.

To avoid the above scenario, according to the present invention a mechanism is provided to recover the excessive delay that is introduced by solving the problem at the "clock cycle" level. According to the invention, a compensation for the effects of leakage caused by temperature variations and/or ageing is performed in the system level timing. For multimedia systems which are stream based this means for instance that it has to be guaranteed that every frame the outputs are computed within the given timing requirements. E.g. for the DAB 12M cycles are available per audio frame. If, at some frame, one or more memories go above the original (design-time) delay specification (which is now not selected worst-case any more), according to the present invention it should be possible to speed up the memories at run-time.

Figure 14:
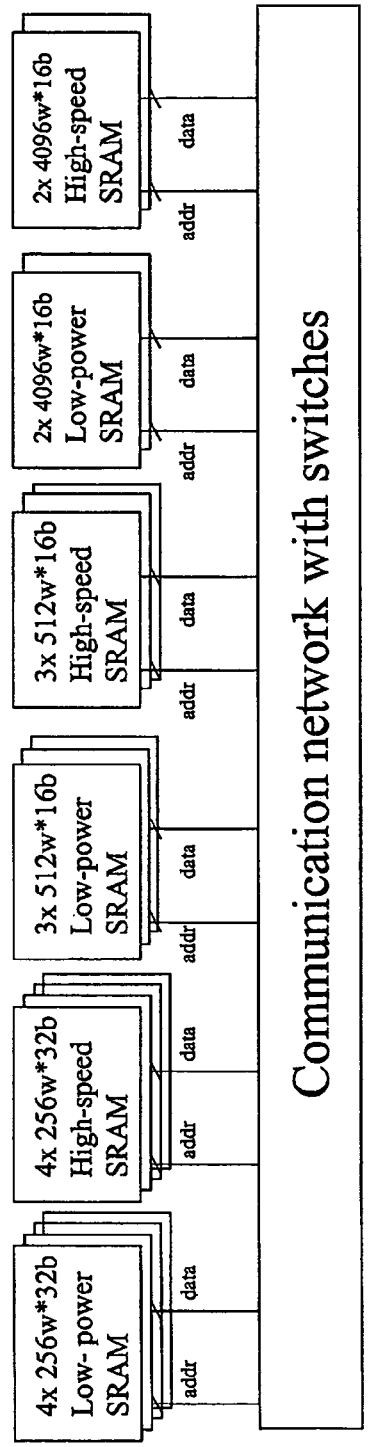
FIG. 14 illustrates a memory organization for a DAB implementation showing 12×8 Kbit+4×64 Kbit SRAM memories in total.
Figure 15:
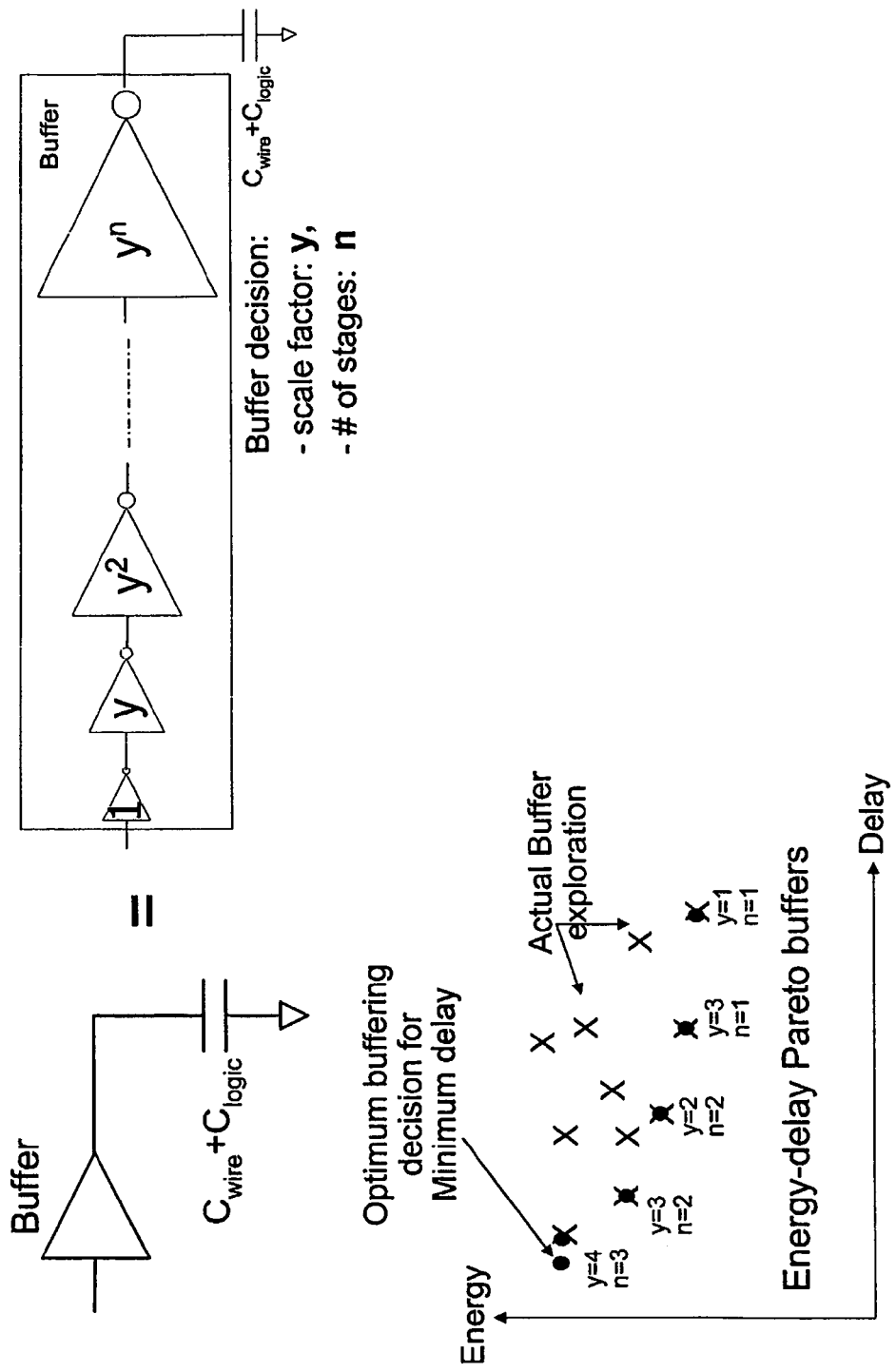
FIG. 15 illustrates Pareto buffer configurations for a memory decoder.

That can be achieved by exploiting the redundancy that is typically available in a given memory organization. In particular, that memory organization is dimensioned for the "worst-case" access bandwidth. But most of the time that much bandwidth is not required. So then several memories or memory banks can be powered down. According to embodiments of the present invention, these non-active memories will be used to give a "boost" when needed at run-time. Even more opportunities for such a boost are created by introducing a partly heterogeneous memory organization. The memories should be heterogeneous, especially in their nominal access delay to potentially compensate for the large delay increase caused by leakage caused by temperature variations and/or ageing. For the DAB a memory organization with 18 memories has been selected: 9 high-performance ones and 9 low energy ones (see FIG. 14). The potential to vary the memory behavior is stimulated even further by providing "knobs" to the memories which allow a run-time controller to select a lower or higher delay. A typical example of that (which is quite cheap to implement in SRAMs) is the buffers that drive the internal decoder lines or the word and bitlines. These buffers can be designed to provide several delay-energy trade-off points. When the speed needs to be boosted, temporarily more energy is invested. An example of such a range is shown in FIG. 15.

Figure 16:
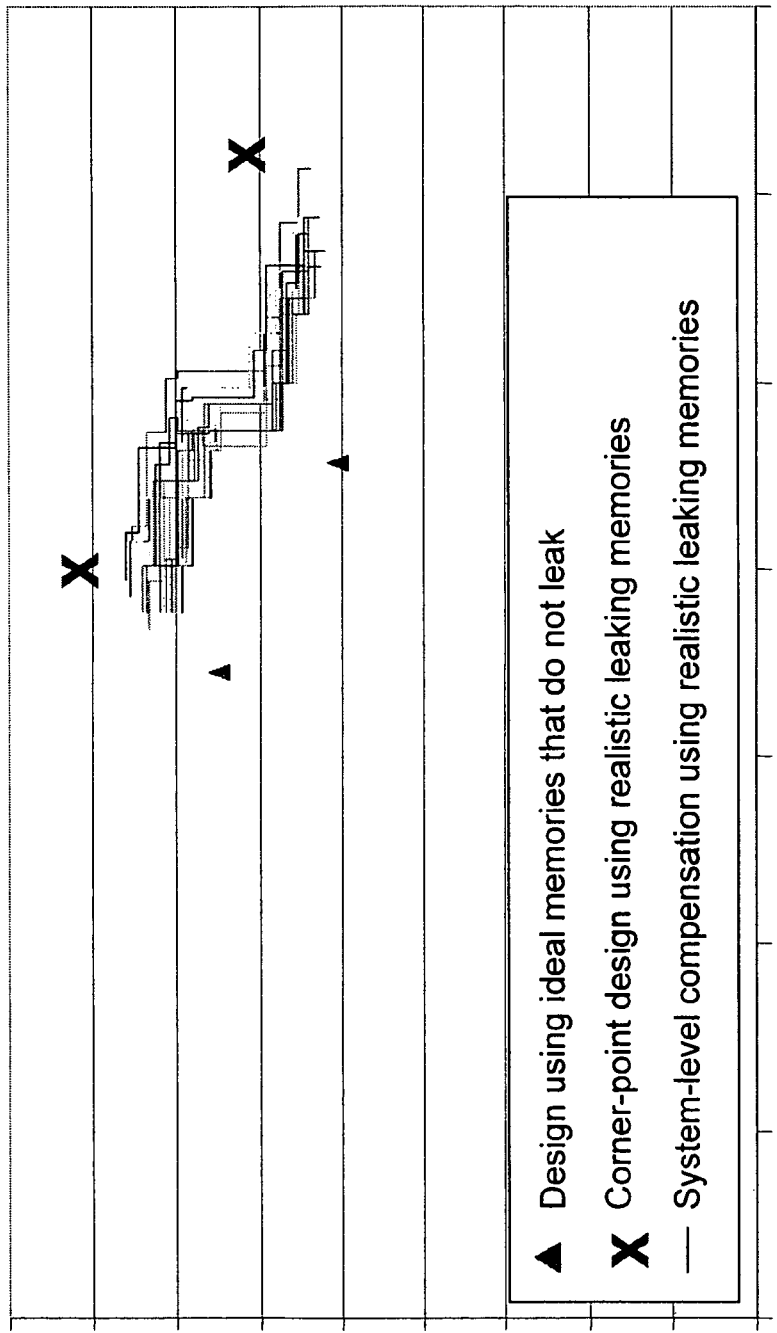
FIG. 16 illustrates design time Pareto optimal mappings for memories under leakage effects caused by temperature variations and/or ageing with emulated clouds.

Providing a variety of access delays that can be dynamically adjusted according to the exact run-time needs, enables a system-level run-time controller to find a number of memories that together can meet the required cycle-time, and such that the address space is also large enough to hold all the data of the application. But that "finding" cannot fully occur at run-time if it is desired to keep the energy efficiency. So a design-time exploration of a number of trade-off optimal cost/performance points, e.g. Pareto-optimal energy-delay trade-off points, that correspond to different mappings (with different values of the knobs) is preferred. The design-time exploration may use SPICE based simulations where the leakage caused by temperature variations and/or ageing clouds are "emulated". Each of these trade-off optimal mappings, e.g. Pareto optimal mappings, is at design-time already stored in the program memory (in a compressed effective form). This leads to several trade-off, e.g. Pareto, curves that depend on the exact point that is active in the leakage caused by temperature variations and/or ageing "cloud" and that are quite different in position compared to the worst-case (3-sigma) curves (see FIG. 16).

The run-time controller that has to start up a new frame, first selects the appropriate cost/performance trade-off point, e.g. energy-delay Pareto point, and loads the corresponding program in the L1-I cache. In the worst case this has to change every frame (which is still only every 12 Mcycles for a 24 ms frame and 500 MHz clock for the DAB) but usually the same point will be valid for several frames even because usually the temperature effects will not cause that fast changes. So the L1-I loading is negligible in both energy and performance effect.

Figure 17:
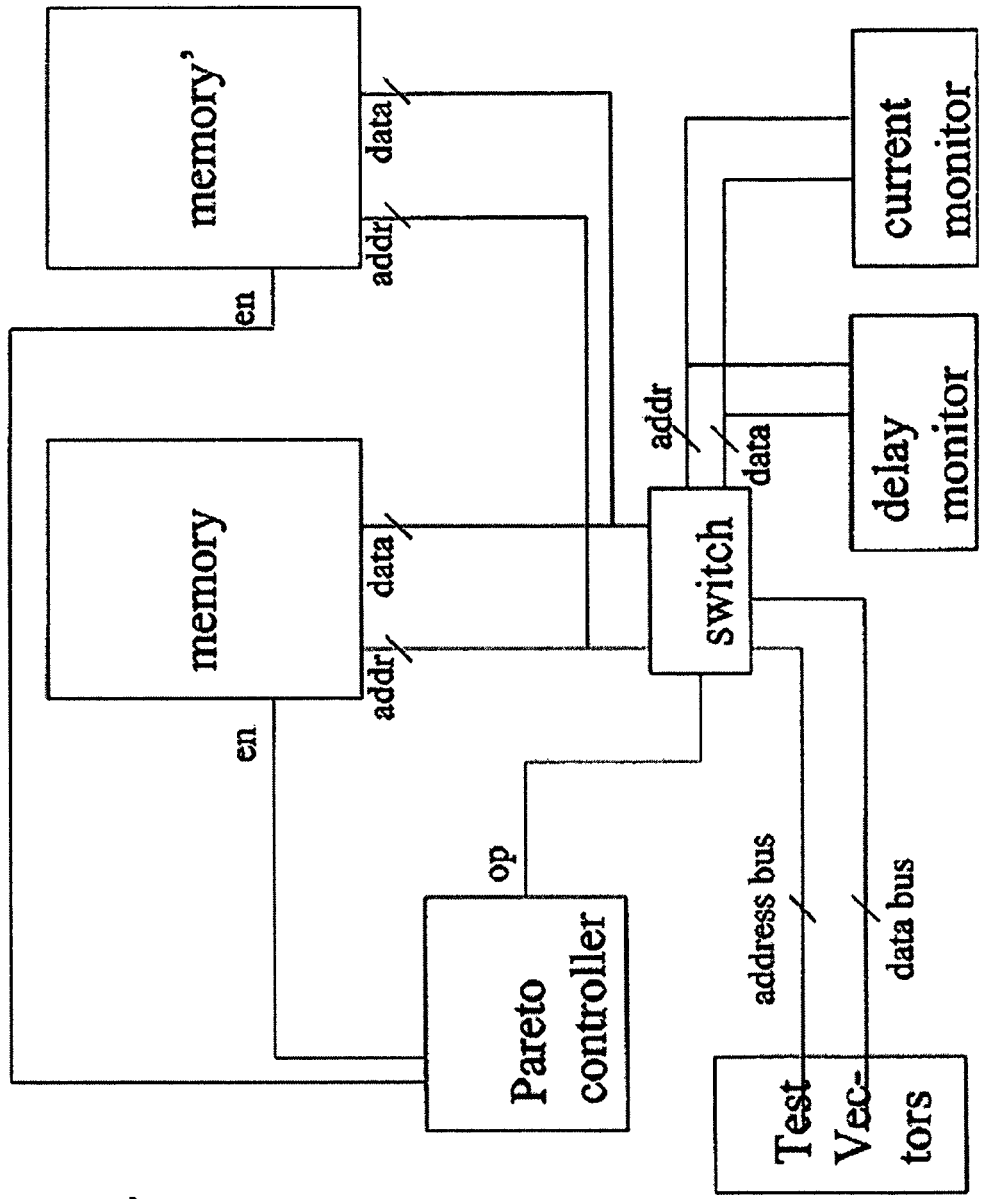
FIG. 17 illustrates a block diagram for run-time controller and calibration loop.

A calibration step may be added after the chip fabrication by using an on-chip calibration loop (see FIG. 17) and probably also once-and-a-while during the life-time of the chip because several effects like degradation due to leakage caused by temperature variations and/or ageing will influence the actual cost/performance, e.g. energy-delay, positions of the trade-off optimal mappings, e.g. Pareto-optimal mappings. For that purpose, the same (few) test vectors that are used at design-time to determine the delay and energy of a memory are used at calibration time to measure these values with monitors. Delay can be monitored with delay lines that have been up-front calibrated from e.g. a crystal and that are designed with wide transistors so that the delay lines are not influenced much by further variations. The energy monitor is based on current measurement, also with wide transistor circuits. The calibration should be done separately for read and write operations.

Now a characterization methodology is discussed to be used in the methods discussed above.

Leakage caused by temperature variations and/or ageing cause transistor performance and energy consumption to deviate from their nominal values. For Deep Sub-Micron (DSM) technologies this variability becomes much more prominent making digital circuits and systems more difficult to predict and control.

System Circuit and Architecture Implementation

Figure 18:
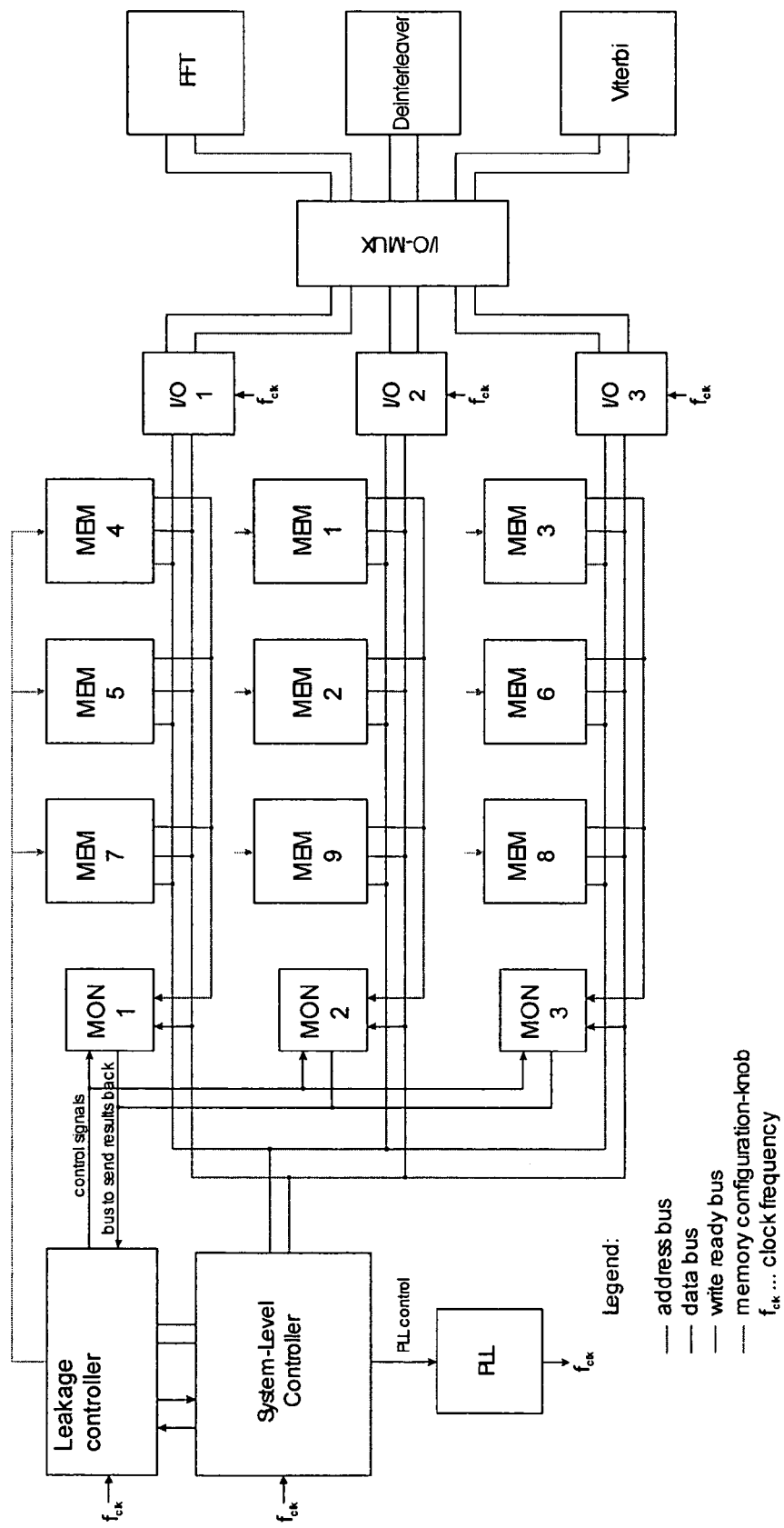
FIG. 18 illustrates an architecture of a system according to an embodiment of the present invention for an experimental set-up with a DAB.

An architecture for monitoring a circuit is provided. A developed architecture for an experimental setup with a DAB receiver is described in detail. In FIG. 18 the final architecture of the system including the simulated functional units of the DAB receiver is shown. However, it is not intended to limit the present invention to this particular architecture. From the description of the architecture below, a person skilled in the art will be able to build other architectures for other circuits.

The architecture of the system including the simulated functional units of the DAB receiver includes the nine memories which are required by the DAB receiver. To provide the DAB receiver with a parallelism of three parallel data transfers the memories are grouped into memory domains and each domain is assigned different address and data busses. These three pairs of busses have their own delay monitor to avoid inaccuracies due to different wire lengths of the busses. Via the input/output-ports of the system the simulated functional units are connected to the busses.

The components shown in the architecture illustrated in FIG. 18 are described in the next paragraphs.

Energy and Delay Monitors

To measure the energy consumption of an access to a memory, an energy monitor is needed. The energy monitor is connected to the power supply of each memory. Potentially one energy monitor per memory might be required for more accuracy in the measurement results. It also needs information about when to start and when to stop the measurement in order to provide sufficient results. Only a simulation of an energy monitor is implemented in the VHDL description of the system, because energy related behavior cannot be simulated in VHDL. Therefore just a register file which contains information about all the different energy consumptions per access of each memory is read by the monitor. To synchronize the monitor with the current memory under test in order to get the correct energy values out of the register file a synchronization with the clock of the system is necessary. The different maximum energy values for read and write for the slow and fast configuration-knob are stored in registers. After the measurement of one memory is completed the content of these registers is sent to the leakage controller (LC). After the measurement of all memories in the design the LC has information about all possible configurations in terms of energy for the complete memory architecture. The energy values are sent to the LC via a dedicated bus. This could be optimized in future by sending the values over the data bus which is not in use during the time the values are sent back and which is connected to the monitor anyhow.

For the measurement of the delay of the memories, a delay monitor based on the work of M. A. Abas et al., "Design of sub-10-picoseconds on-chip time measurement circuit", Proc. DATE, vol. 2, pp. 804-809, February 2004, is used. As mentioned before, three delay monitors are introduced in the architecture to avoid inaccuracies due to different bus lengths. The principle of measurement which was presented above is used.

The monitor itself consists of two separate chains of delay lines and it measures the time difference between the rising edge of two different signals. The first signal, called start signal is sent through a slower delay line chain and the second signal, called test signal through a faster delay line chain in order to catch up with the start signal. Comparators are introduced along these chains. When the test signal catches up with the start signal the respective comparator output becomes true. So the output of the delay monitor is a so-called thermometer code gained from all single comparator results. The time difference between the two edges is then calculated as the number of delay line times the delay difference between delay lines of the fast and the slow chain.

This delay monitor can measure the delay difference between two one-bit signals. So the granularity of the measurement is defined by the delay difference between the fast and slow chain. The delay of the stages of the fast line is 50 psec, for the stages of the slow line it is 100 psec. Therefore the accuracy of this circuit is 50 psec which is sufficient given the performance of current embedded memories. One stage of the delay line chain consists of buffers in each line which introduce the delay and a comparator. To be able to measure a range of delay from 400 psec up to 1.55 nsec 23 delay line stages have to be used. Additionally an initial delay of 400 psec exists before the delay line chains in order to save stages. This is feasible due to the fact that no delay lower than 400 psec has to be measured. The measurement results given in a thermometer code of a length of 23 bits is analyzed and transformed into a five-bit value.

Figure 19:
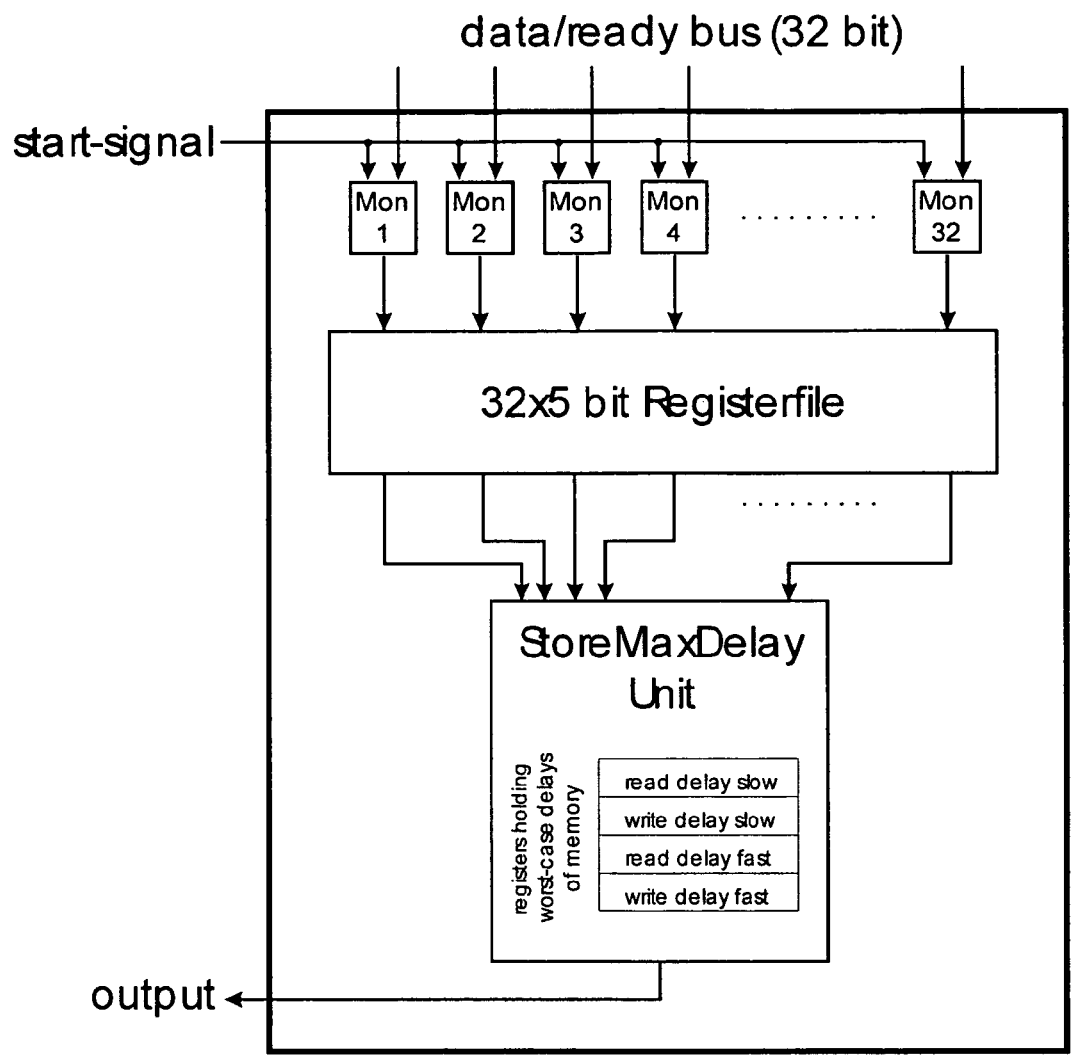
FIG. 19 illustrates the components of a complete delay monitor.

Since the delay monitor can only measure the delay difference between two one-bit signals and the goal is to measure the output of memories with a maximum bitwidth of 32, the complete delay monitor of the architecture consist of 32 such one-bit monitors and 32 registers of five bits each, as illustrated in FIG. 19. As described above, the 32 monitors asynchronously measure the delay of the different memory output bits and store them in a register. To calculate the worst-case delay of a single bitline all the measurement results of one bitline are written into a 32 times 5 bit registerfile. A unit, called the StoreMaxDelay, is provided for storing worst-case delays. The StoreMaxDelay-Unit is comparing in parallel the contents of the 5 bit registerfile and the worst-case delay is stored in a register. To find the worst-case of all the wordlines this register where the worst case delay is stored is only updated when another bitline delay is bigger than the stored worst-case delay. The number of registers where the worst-case delays are stored is equal to the pre-determined number mentioned above, e.g. four when the maximum read and write delay for the slow and fast configuration-knob are measured. Similar to the energy monitor the four maximum delay values stored in these registers are sent to the LC after the complete measurement of one memory.

Leakage Controller (LC)

The LC is responsible for the control of the measurement and calibration and configuration-knob selection of the memory architecture. It is implemented as a Finite State Machine for the measurement and calibration phase.

The LC can calibrate the memories to a given cycle-time constraint or to a given time-frame constraint. This functionality leads to two different implementations of the LC which are discussed next.

1. Clock-Cycle-Level Adaptation

This version of the controller measures only the delay per access of the memories, since only delay adaptation can be achieved using this technique. The LC is based on a system that has a fixed clock frequency in normal operation phase. So the memories of the system have to meet a fixed cycle-time constraint. This constraint is defined at design-time of the architecture and stored into a register which is known by the LC.

Figure 20:
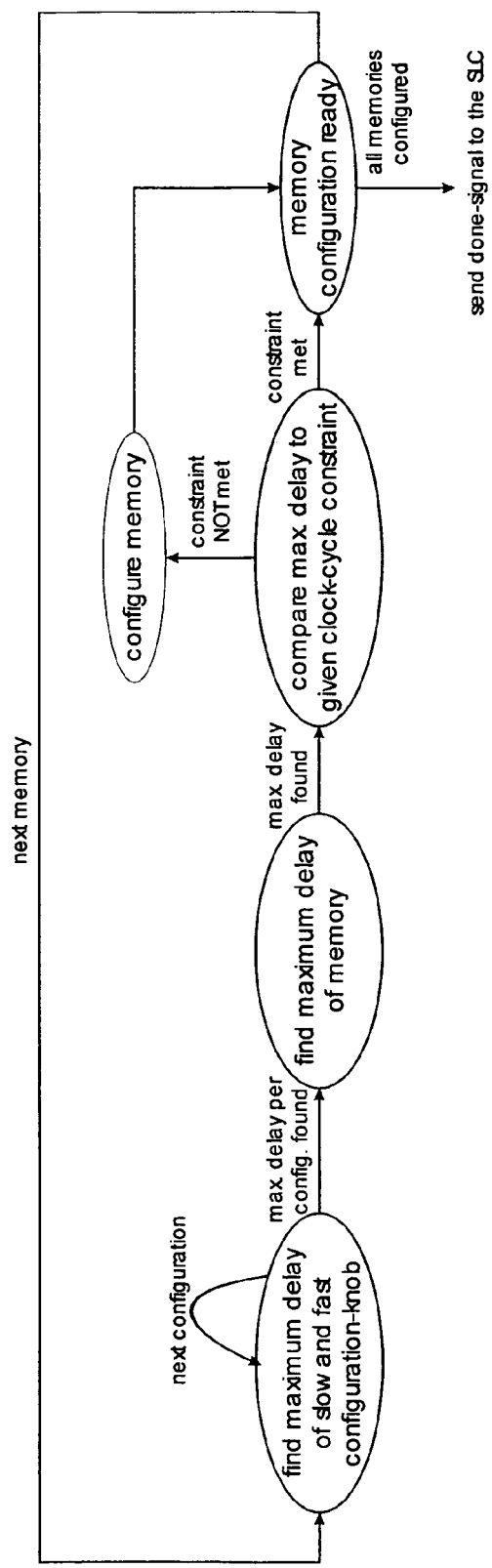
FIG. 20 illustrates the states of calibration for clock-cycle-level adaptation.

The LC measures the maximum delay values for each configuration of the memory architecture (slow read; fast read; slow write; fast write) and stores them into a register file. In the calibration phase based on FIG. 20 the maximum delay of a memory per configuration-knob is calculated. To make sure that the slow configuration-knob of the memory is really slower than the fast one also these two maximum delays which were calculated before are compared. This problem could occur if the memory clouds overlap. The maximum delay of each memory is then compared to the cycle-time constraint. If the memory can meet the constraint with its less energy consuming slow configuration-knob there is no need to adapt. In case the memory cannot meet the constraint with this configuration-knob it has to be configured with the fast configuration-knob. After the configuration for all memories of the system is applied the LC sends the done-signal to the system level controller (SLC) in order to proceed with the normal operation phase. During the normal operation phase the LC is inactive.

2. Time-Frame-Level Adaptation

The time-frame-level implementation of the LC additionally needs the energy consumption per access of each memory in the architecture. So the controller holds information about the maximum delays and energy consumptions per access of the complete memory architecture. Based on this information it is able to decide how the memories need to be configured in order to meet a given run-time constraint for executing the target application on the chip. This run-time constraint is obtained at design-time and stored into a register. Furthermore the LC needs information about the number of cycles each functional unit uses within one time-frame. So this LC can only be used for frame-based applications in which the functional units are executed sequentially. For the application of the DAB receiver this time-frame is one single audio-frame.

For the experimental setup with the DAB receiver the LC splits the normal operation phase where the functional units are executed into three more phases (see FIG. 21): execution of the FFT, the Deinterleaver and the Viterbi. At the beginning of each of these phases, the clock of the system can be adjusted, more particularly its frequency can be adjusted. Due to the fact that the different functional units FFT, Deinterleaver and Viterbi are communicating between each other through interface memories (see FIG. 18) also the configuration-knob of these memories has to be adjustable at the boundary of each phase or functional unit. These three phases together with the adjustable clock-frequency of the system provide more possibilities to save energy compared to the clock-cycle-level adaptation.

The execution of the Viterbi is the most energy consuming and slowest phase in normal operation. It might be necessary that the clock of the system has to be slowed-down to make sure that all memories accessed during the Viterbi can be accessed within one clock-cycle in their slow and less energy consuming configuration-knob. In order to meet the time-frame constraint the memories of one or both of the other two phases might have to use the fast and more energy consuming configuration-knob. So with this configuration the LC can allow the lowest possible energy consumption for executing one audio-frame of the DAB receiver and it still makes sure that the time-frame constraint can be met. Of course with the assumption that the system is properly designed.

The first step the LC does after the start-up of the system is again a measurement phase. After the information about delay and energy consumption of each of the memories is available, the LC is able to enter the calibration phase. In this phase, as shown in FIG. 29, the maximum delay of each memory for its slow and fast configuration-knob is calculated. Based on these maximum memory delays and the mapping of the memories to the functional units FFT, Deinterleaver and Viterbi (FIG. 24), the tightest cycle-time for low-power and high-speed configuration of each functional unit can be obtained. To reduce the overhead in terms of area and energy consumption of the LC, the memories of one of these three phases can only be switched to the same configuration knob. Theoretically the optimal energy configuration can be gained by switching the memories independently to allow memories which are fast enough to stay in the slow configuration-knob. So with the implemented LC eight possible configurations are possible as shown in table 1 hereinbelow.

TABLE 1

The eight possible configurations with three phases in normal operation phase.

Figure 21:
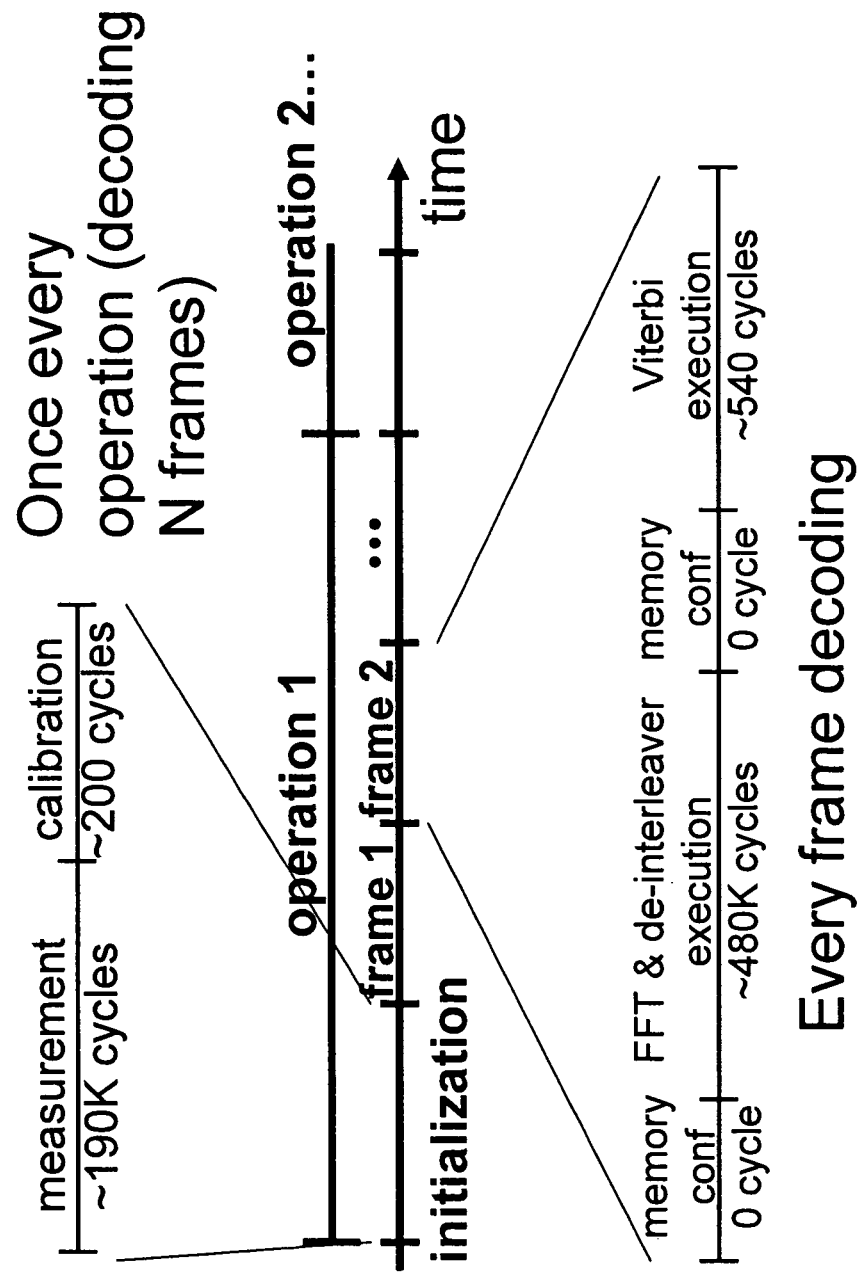
FIG. 21 illustrates the phases of time-frame-level adaptation.
Figure 22:
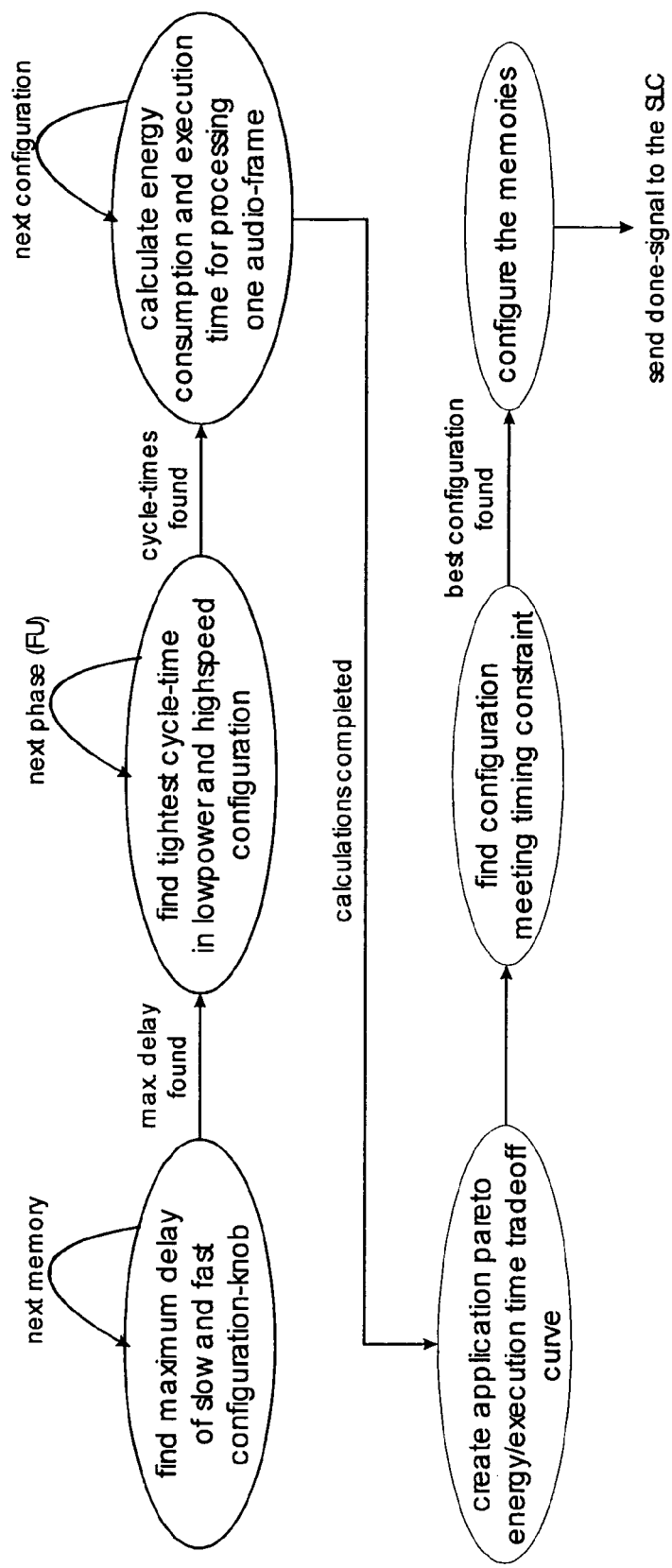
FIG. 22 illustrates the states of calibration for the time-frame-level adaptation

| Configuration | | |
|---|---|---|
| FFT | Deinterleaver | Viterbi |
| low-power | low-power | low-power |
| low-power | high-speed | low-power |
| high-speed | low-power | low-power |
| high-speed | high-speed | low-power |
| low-power | low-power | high-speed |
| low-power | high-speed | high-speed |
| high-speed | low-power | high-speed |
| high-speed | high-speed | high-speed | low-power: all memories of this phase are configured to slow
high-speed: all memories of this phase are configured to fast For these eight possible configurations the energy consumption and the execution time for processing one audio-frame of the DAB receiver is calculated based on the measured information about the memory architecture. For the calculation of the energy the access frequencies of the memories are needed. They are available in registers. So, as can be seen in FIG. 22, in the next step the energy consumption and the execution time for each configuration are calculated. The results for each configuration are stored into a register file. With all the calculated information a trade-off cost/performance curve, e.g. a Pareto energy/execution time trade-off curve, can be obtained. Based on this trade-off curve the closest configuration to the time-frame constraint which has the lowest energy consumption is chosen. In the next step this configuration is applied to the memory architecture via the memory configuration-knobs. Also the switches of the configuration-knobs of the memories and the clock-frequency adaptation at the boundaries of the three phases during the execution of an audio-frame are decided in this step. Therefore, as FIG. 21 shows, it is possible to perform the configuration-knob switch and the adaptation of the clock-frequency without stopping the execution of the functional units.

System-Level-Controller (SLC)

This controller is responsible for the execution of the different phases at the right time. So the SLC is implemented as a Finite State Machine that defines which phase is going to be executed. After the start-up of the system the SLC starts the measurement phase of the LC. After the LC has finished with the measurement phase a done signal is received by the SLC. So the SLC knows that measurement is done and starts the calibration phase of the LC. After completing the calibration again a done signal is received and the SLC starts the normal operation phase in which it acts as the memory management unit of the functional units and provides the network controller with the right source and destination block-addresses. This memory management functionality within the SLC is also implemented as a Finite State Machine. For synchronization purposes the SLC also transmits and receives start and stop signals to and from the functional units. This is necessary because the SLC has to tell the LC and the PLL at the boundary of each of the three phases in normal operation phase to switch the memory configuration-knobs and to adjust the clock frequency. When the cycle-accurate behavior is exactly known the SLC can be replaced by an instruction-memory-hierarchy and the signals which are needed for synchronization issues can be removed.

Memory

To maximize parametric yield at the system level it is required to add run-time configuration capabilities to the memory. A controller will configure the memories at run-time to a setting which meets the cycle time constraints in case the run-time execution constraints are violated during operation.

The memories of the architecture are implemented with a completely asynchronous interface. To inject leakage caused by temperature variations and/or ageing, a package with timing information, e.g. generated by a C-program, is involved in the VHDL description of the memory. Using the following terminology the memory is provided with different delays for each bitline.

for i in data_width-1 down to 0 loop
ready(i)<=transport '1' after rd_delay_fast(cdata_width_max-1-i);
end loop;

In order to get a completely asynchronous interface which is also taking into account the additional network delay, the memory has a process which is listening to the address and data port. When the chip select signal of the memory is activated and when the address in read mode or when the address and the data in write mode of the memory are stable, the process starts adding the delay of the memory due to leakage caused by temperature variations and/or ageing as described above. The process is creating an internal signal, and when this signal is stable too, the data is written into the memory or transferred to the output port depending on whether the memory is currently read or written. In write mode the memory also drives another output called ready port. This port is necessary to measure the write delay of a memory as discussed above.

Communication Network

The three different address, data and ready buses shown in FIG. 18 are implemented in the communication network based on segmented buses. The memory organizations of low-power systems are typically distributed so a centralized switch implementation would be a bad design choice. This communication network provides a bandwidth of three parallel transfers per cycle. The buses are bi-directional shared connections among a number of blocks and the long wires are split into segments using switches.

The SLC and the LC have to supply a source and a destination block-address and the number of transactions which are performed in parallel. The LC has to do this in the measurement phase when it is applying test vectors to the memories and reading the measured values from the monitors. The SLC takes care of applying the right block-addresses in normal operation phase instead of the memory management unit of the functional units as mentioned in the section about the system level controller. A small network controller with a look-up table controls the configurations of these switches. Based on the source and destination block-address of the current communication the controller finds the correct entry in the table and applies it to the switches.

Phase-Locked-Loop

The task of the phase-locked-loop (PLL) is the adaptation of the system clock. As discussed in previous sections the clock frequency is adapted at the boundaries between the functional units in normal operation phase. For measurement the clock is relaxed to a clock-cycle of 3 nsec to make sure to have stable results from the one-bit monitors (see above).

Due to the complexity of the PLL in first instance only a frequency divider may be implemented. This frequency divider is able to adjust the frequency of the system to a given value. This value is applied by the SLC for all different phases. In normal operation phase the SLC receives this values from the LC. The clock-cycle values for measurement and calibration phase are fixed and stored in registers. The value itself is given in the same format as the delay of the memories and represents the time for one single clock-cycle. So the value of the clock can be calculated using formula:

PLL_clock_value=cycle_time[ps]/50 ps-400 ps

Application: Digital Audio Broadcast Receiver

Figure 23:
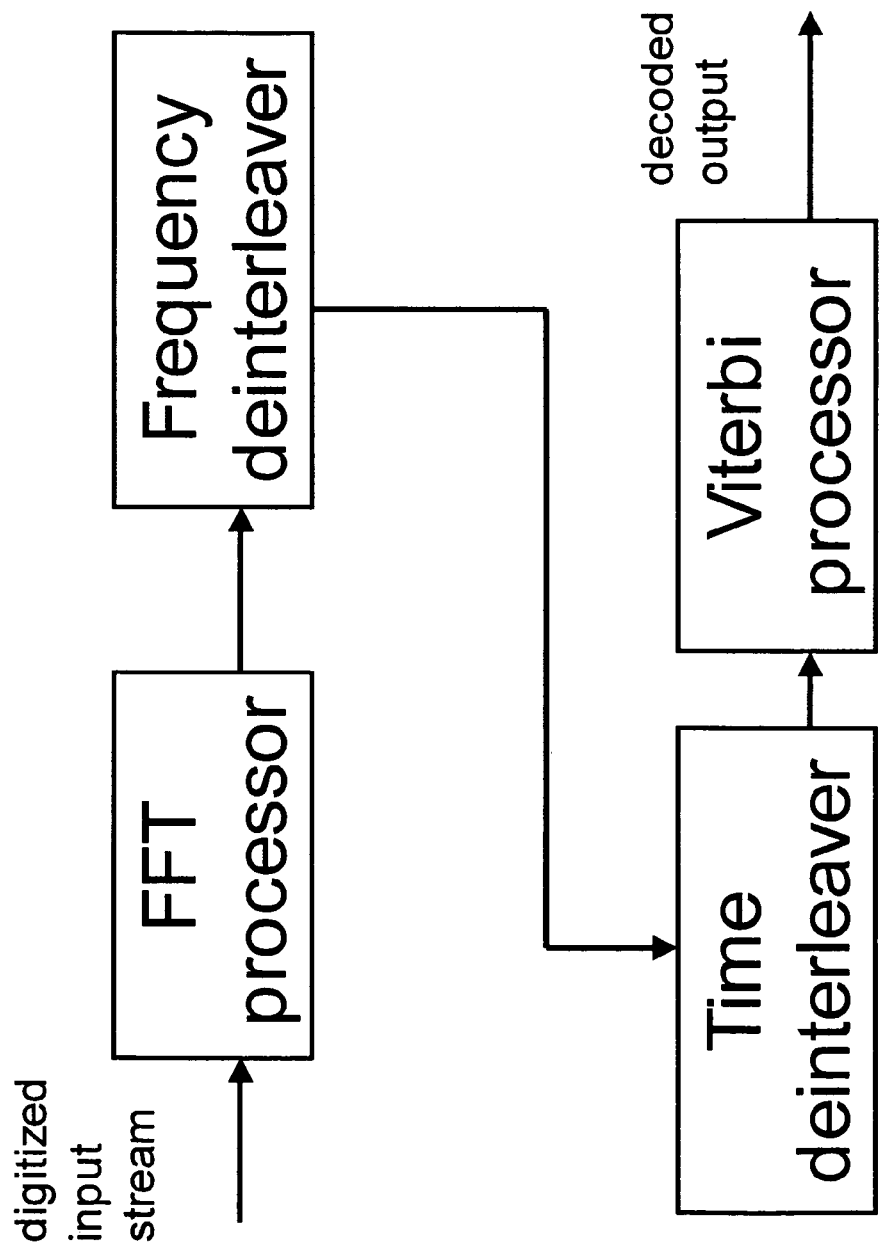
FIG. 23 shows a block diagram of a Digital Audio Broadcast receiver.

The described technique will be described referring to an application specific design implementing a Digital Audio Broadcast (DAB) receiver, as illustrated in FIG. 23.

The transmission system in the DAB standard is based on an Orthogonal Frequency Division Multiplex (OFDM) transportation scheme using up to 1536 carriers (Mode I) for terrestrial broadcasting. At the DAB receiver side the OFDM carrier spectrum is reconstructed by doing a forward 2048-point FFT (Mode I) on the received OFDM symbol. This functionality is assigned to the FFT processor shown in FIG. 23.

Forward error correction and interleaving in the transmission system greatly improve the reliability of the transmitted information by carefully adding redundant information that is used by the receiver to correct errors that occur in the transmission path. The frequency and time de-interleaver blocks unscramble the input symbols and the Viterbi processor is the one performing the error detection and correction based on the redundant information.

The energy optimal mapping of the DAB application data results in a distributed data memory organization that consists of nine memories, seven of them having a capacity of 1 KByte, one of 2 KByte and the last one of 8 KByte. Their bitwidths are either 16 or 32 bits.

Four distinct functionalities are performed in the decoding of the input signal as shown in FIG. 23. During the hardware/software partitioning of the application it has been decided to have dedicated hardware for the implementation of the FFT and the Viterbi functionalities, while the frequency and time de-interleaving is performed on a processor. However, the Viterbi functionality is the most computing intensive, requiring more than half of the total execution time for decoding of a frame. Furthermore, it is assumed that the FFT and Viterbi are not pipelined, they operate on the same frame sequentially. As a result, it has been decided to keep the FFT and the de-interleavers running on the same clock frequency and the Viterbi will run on a different one. This way energy can be traded-off for a faster execution in any of these two groups of functionalities if leakage caused by temperature variations and/or ageing makes the system too slow.

Figure 24:
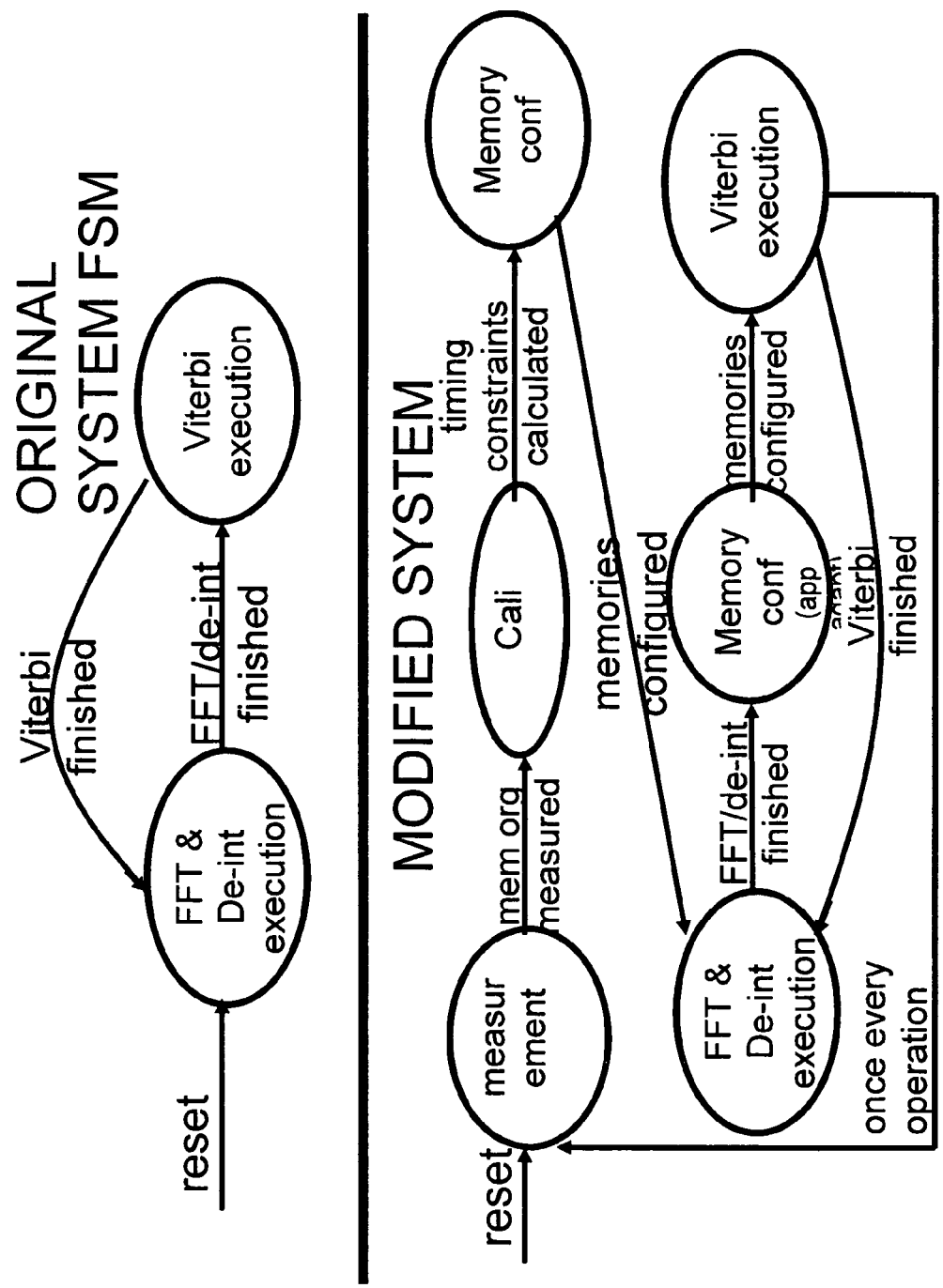
FIG. 24 shows on top an abstract view of the original Finite State Machine of the DAB design. The bottom part of FIG. 24 shows the additional states that are required to implement the necessary functionality for run-time compensation of process variability impact.

FIG. 24 shows a simplified original Finite State Machine for the execution of the DAB application without the compensation for leakage caused by temperature variations and/or ageing (top) and the one including it (bottom). Additional states are needed to accommodate for the measurement and calibration phases as well as the state where the memories are configured. As mentioned earlier, these additional states required for the compensation can be added without affecting the control of the application execution. According to embodiments of the present invention, the calibration phase can be repeated several times during operation, in order to accommodate for changing leakage conditions caused by temperature variations and/or ageing.

In the measurement state the delay and the energy consumption of each memory in the organization is measured and the information is communicated back to the controller. During calibration the controller calculates the optimal cycle times for execution of the FFT and de-interleavers and for the execution of the Viterbi, such that the run-time operation is guaranteed and global energy consumption is minimized. The knob selection phase is where the controller configures each memory to meet the required cycle time constraint. The architecture which can implement such an FSM is discussed hereinabove.

It is to be understood that although preferred embodiments, specific constructions and configurations have been discussed herein for devices according to the present invention, various changes or modifications in form and detail may be made without departing from the scope and spirit of this invention.

What is claimed is:

1. A method for generating an electronic system, comprising a run-time controller and an electronic circuit, wherein the run-time controller is configured to control the electronic circuit based on trade-off information, and actual performance of said electronic circuit differs from simulated performance of said electronic circuit, the method comprising:
   generating, by using a computer, a system-level description of the functionality and timing of said electronic circuit, wherein said system-level description is based on simulated performance of said electronic circuit and includes first trade-off information;
   generating said run-time controller based on said system-level description; and
   generating a process variation controller configured to generate second trade-off information by modifying said first trade-off information based on a performance measurement of said electronic circuit operating in an operational mode, wherein during said performance measurement, said electronic circuit is controlled by said run-time controller using said first trade-off information,
   wherein determining the second trade-off information comprises performing measurements on an operational actual electronic circuit,
   wherein said run-time controller is further configured to select an operating point from a plurality of operating points based on said second trade-off information, and wherein said selected operating point is selected to compensate for performance of said electronic circuit affected by leakage caused by at least one of temperature variations and ageing.

2. The method according to claim 1, wherein the second system level description is operable in various working modes, each of said working modes having a unique performance/cost characteristic, said performance/cost characteristics of said working points defining a performance/cost trade-off relationship,
   said actual electronic circuit being configured to operate in said working modes.

3. The method according to claim 1, wherein the first trade-off information comprises Pareto information.

4. The method according to claim 1, wherein the first trade-off information is trade-off information for software to run on a manufactured actual electronic circuit.

5. The method according to claim 1, wherein the first trade-off information is trade-off information of hardware in a manufactured actual electronic circuit.

6. The method according to claim 1, wherein the electronic circuit is a memory.

7. The method according to claim 1, wherein the second trade-off information is obtained by calibration of a manufactured actual electronic circuit operating according to the first trade off information.

8. The method according to claim 1, wherein the run-time controller is implemented as any of an operating system, dedicated hardware or a combination of these.

9. The method according to claim 1, wherein modifying said first trade-off information comprises calibrating said first trade-off information to correct values.

10. The method according to claim 1, wherein said run-time controller is further configured to deactivate failing circuitry.

11. A method for generating an electronic system, comprising a run-time controller and an electronic circuit comprising a plurality of modules, wherein the run-time controller is configured to control the modules based on trade-off information, and actual performance of said electronic circuit differs from simulated performance of said electronic circuit, the method comprising:
   generating, by using a computer, a system-level description of the functionality and timing of said modules, wherein said system-level description is based on simulated performance of said modules and includes first trade-off information;
   generating said run-time controller based on said system-level description; and
   generating a process variation controller configured to generate second trade-off information by modifying said first trade-off information based on a performance measurement of said electronic circuit operating in an operational mode, wherein during said performance measurement, said electronic circuit is controlled by said run-time controller using said first trade-off information,
   wherein determining the second trade-off information comprises performing measurements on an operational actual electronic circuit,
   wherein said run-time controller is further configured to select an operating point from a plurality of operating points based on said second trade-off information, and wherein said selected operating point is selected to compensate for performance of said electronic circuit affected by leakage caused by at least one of temperature variations and ageing.

12. The method according to claim 11, wherein the trade-off information comprises Pareto information.

13. The method according to claim 11, wherein the run-time controller is implemented as any of an operating system, dedicated hardware or a combination of these.

14. The method according to claim 11, wherein modifying said first trade-off information comprises calibrating said first trade-off information to correct values.

15. The method according to claim 11, wherein said run-time controller is further configured to deactivate failing circuitry.

* * * * *

UNITED STATES PATENT AND TRADEMARK OFFICE
CERTIFICATE OF CORRECTION

PATENT NO. : 8,578,312 B2  
APPLICATION NO. : 11/252370  
DATED : November 5, 2013  
INVENTOR(S) : Papanikolaou et al.

Page 1 of 1

It is certified that error appears in the above-identified patent and that said Letters Patent is hereby corrected as shown below:

Title Page (item 54, Title) at line 5, and in the Specification, in column 1 at line 5, Change "AGING" to --AGEING--.

In the Drawings:

Sheet 8 of 23 (Fig. 8) at line 4, Change "monitros" to --monitors--.

In the Specification:

In column 1 at line 33, Change "know" to --known--.

In column 1 at line 35, Change "an/or" to --and/or--.

In column 9 at line 44, Change "adaptation" to --adaptation.--.

In column 18 at line 3, Change "ampliflier" to --amplifier--.

In the Claims:

In column 28 at line 4, In Claim 7, change "trade off" to --trade-off--.

Signed and Sealed this  
Twenty-fourth Day of June, 2014

Michelle K. Lee  
*Deputy Director of the United States Patent and Trademark Office*